US011171122B2

(12) United States Patent
Horie et al.

(10) Patent No.: US 11,171,122 B2
(45) Date of Patent: Nov. 9, 2021

(54) SEMICONDUCTOR DEVICE

(71) Applicant: FUJI ELECTRIC CO., LTD., Kawasaki (JP)

(72) Inventors: Shunta Horie, Kawasaki (JP); Susumu Iwamoto, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/004,967

(22) Filed: Aug. 27, 2020

(65) Prior Publication Data

US 2020/0395344 A1 Dec. 17, 2020

Related U.S. Application Data

(63) Continuation of application No. PCT/JP2019/035919, filed on Sep. 12, 2019.

(30) Foreign Application Priority Data

Sep. 14, 2018 (JP) .............................. JP2018-172440

(51) Int. Cl.
*H01L 23/498* (2006.01)
*H01L 25/07* (2006.01)
*H01L 23/00* (2006.01)
*H01L 25/18* (2006.01)

(52) U.S. Cl.
CPC ...... *H01L 25/072* (2013.01); *H01L 23/49811* (2013.01); *H01L 23/49844* (2013.01); *H01L 24/48* (2013.01); *H01L 25/18* (2013.01); *H01L 2224/48139* (2013.01); *H01L 2224/48227* (2013.01); *H01L 2924/12036* (2013.01); *H01L 2924/13055* (2013.01); *H01L 2924/14252* (2013.01)

(58) Field of Classification Search
CPC ............. H01L 25/072; H01L 23/49811; H01L 23/49844; H01L 24/48; H01L 25/18; H01L 2224/48227; H01L 2924/12036; H01L 2924/13055; H01L 2924/14252
USPC ....................................................... 257/668
See application file for complete search history.

(56) References Cited

U.S. PATENT DOCUMENTS

| 2002/0024135 | A1 | 2/2002 | Arai et al. |
| 2013/0001805 | A1 | 1/2013 | Azuma et al. |
| 2016/0072499 | A1 | 3/2016 | Ichikawa |
| 2016/0351505 | A1 | 12/2016 | Tamada et al. |

FOREIGN PATENT DOCUMENTS

| DE | 19549011 A1 | 7/1997 |
| JP | 2002-153079 A | 5/2002 |
| JP | 2013-012560 A | 1/2013 |
| JP | 2016-058515 A | 4/2016 |
| WO | 2015/121899 A1 | 8/2015 |

*Primary Examiner* — Elias Ullah
(74) *Attorney, Agent, or Firm* — Rabin & Berdo, P.C.

(57) ABSTRACT

The semiconductor device includes a substrate having a main surface, a plurality of conductive patterns provided on the main surface, a plurality of switching elements disposed on one of the conductive patterns, each switching element having a first electrode and a second electrode and being connected to the one of the conductive patterns through its first or second electrode, and at least one first wiring member each directly connecting the first electrodes of two switching elements that are respectively disposed on different conductive patterns and are electrically connected in parallel.

20 Claims, 9 Drawing Sheets

SEMICONDUCTOR DEVICE

This is a continuation application of International Application PCT/JP2019/035919 filed on Sep. 12, 2019 which claims priority from a Japanese Patent Application No. 2018-172440 filed on Sep. 14, 2018, the contents of which are incorporated herein by reference.

TECHNICAL FIELD

The present invention relates to a semiconductor device that includes a plurality of switching elements.

BACKGROUND ART

As power conversion devices applied in the field of new energy such as wind power/solar power generation and the field of vehicles, there is a semiconductor device using power semiconductor elements as switching elements. For example, for the semiconductor device for power conversion, IGBTs (Insulated Gate Bipolar Transistors) excellent in high-voltage, high-current, and high-speed switching operations are used as the switching elements.

An example of a semiconductor device using IGBT elements as the switching elements will be described. For example, in a semiconductor device for power conversion, a power module configured with an upper arm and a lower arm is inserted between a high power supply potential (P) and a lower power supply potential (N). When the IGBT elements are used as the switching elements in the power module, each of the upper arm and the lower arm is configured with the IGBT elements and free wheeling diodes (FWD). The IGBT elements configuring the upper arm and the IGBT element configuring the lower arm are connected in series. Further, in each of the upper arm and the lower arm, sets of the IGBT element and the FWD are connected in parallel so as to expand the current-carrying capacity as the module.

By the way, in the configuration where the IGBT elements are connected in parallel, there is a possibility of having oscillation at the time of switching operations depending on the conditions such as the gate capacitance of the IGBT elements, inductance between the IGBT elements connected in parallel, inductance between the IGBT gates, and the like. When oscillation occurs in the power module, a voltage exceeding pressure resistance may be applied to the gate terminals of the IGBTs, so that various kinds of measures are taken. For example, in the power module for power conversion, emitter electrodes of the two IGBT elements that are connected in parallel and disposed on a same insulating substrate (conductive pattern) are electrically connected via a conductor wire (see FIG. 1 of Patent Literature 1, FIG. 24 of Patent Literature 2). By taking such measures, the potentials of the emitter electrodes of a plurality of IGBT elements connected in parallel are made uniform.

In the meantime, there is proposed a power module for power conversion in which a plurality of IGBT elements belonging to a same arm are disposed on different substrates (conductive patterns) and those IGBT elements are connected in parallel via the conductive patterns (for example, see Patent Literature 3). In the power module disclosed in patent Literature 3, conductor patterns are provided to be adjacent to each other along the different substrates (conductive patterns) on which the IGBT elements are disposed. Further, the emitter electrodes of the IGBT elements are connected, respectively, to the adjacent conductor patterns, and the conductor patterns are connected.

CITATION LIST

Patent Literature

Patent Literature 1: DE 19549011 A1
Patent Literature 2: Japanese Patent Laid-Open No. 2002-153079
Patent Literature 3: Japanese Patent Laid-Open No. 2016-58515

SUMMARY OF INVENTION

However, when the IGBT elements belonging to a same arm are disposed on different substrates (conductive patterns) and connected in parallel, it is found that the inductance caused by the conductive patterns and the like connecting between the emitter electrodes is increased and an oscillation phenomenon cannot be suppressed sufficiently. The oscillation phenomenon is also the issue with switching elements other than the IGBT elements (for example, MOSFET elements, reverse conducting IGBT elements, and the like).

The present invention is designed in view of the foregoing issues, and one of the objects thereof is to provide a semiconductor device capable of suppressing the oscillation phenomenon at the time of switching operations even with a configuration in which switching elements are disposed on different conductive patterns and connected in parallel.

The semiconductor device according to an embodiment includes: a substrate having a main surface; a plurality of conductive patterns provided on the main surface; a plurality of switching elements disposed on the plurality of conductive patterns such as to connect collector electrodes; and a single or a plurality of wiring members that directly connect emitter electrodes of the switching elements that are disposed on different conductive patterns and connected in parallel among the plurality of switching elements.

According to the present invention, even with the configuration in which the switching elements are disposed on the different conductive patterns and connected in parallel, it is possible to suppress the oscillation phenomenon at the time of the switching operations by a single or a plurality of wiring members that directly connect the emitter electrodes of the switching elements to each other.

DESCRIPTION OF EMBODIMENTS

While a case where a semiconductor device according to an embodiment is applied to a power module of an inverter circuit will be described hereinafter, the semiconductor device is not limited to the inverter circuit. The semiconductor device of the embodiment can be applied to any power modules other than the inverter circuit if the power module has a configuration in which power switching elements disposed on different conductive patterns are connected in parallel. Further, while a case of using IGBT elements for the switching elements will be described in the embodiment, it is also possible to use power switching elements other than the IGBT elements. For example, instead of the IGBT elements, MOSFET (Metal Oxide Semiconductor Field Effect Transistor) elements may be used. In this specification, IGBT element and MOSET element may be referred to as a switching element, an emitter electrode and a source electrode may be referred to as a first electrode, and a collector electrode and a drain electrode may be referred to as a second electrode. In the case of the MOSFET element, an emitter electrode may be referred to as a source electrode and a collector electrode may be referred to as a drain electrode instead. Further, not limited to a case described in the embodiment where an IGBT and a free wheeling diode are provided on different semiconductor chips from each other, it is also possible to apply a reverse conducting IGBT (RC-IGBT) that is a single element in which an IGBT part and an FWD part are combined. For the switching elements and the diodes, silicon (Si) semiconductors or silicon carbide (SiC) semiconductors can be used.

Figure 1:
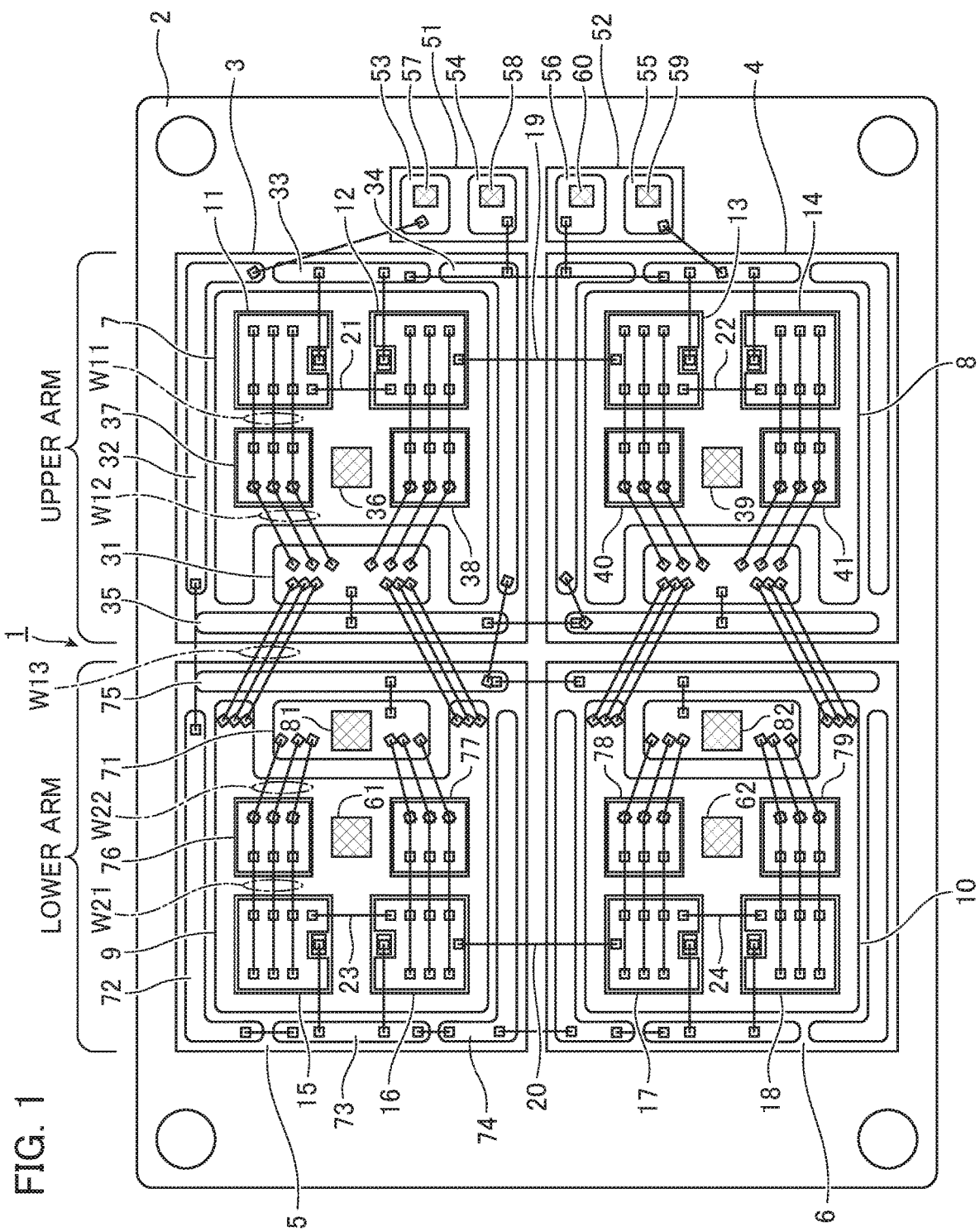
FIG. 1 is a plan view showing a case where a semiconductor device according to an embodiment is applied to a power module.

FIG. 1 is a plan view showing a case where the semiconductor device according to the embodiment is applied to a power module. A semiconductor device 1 according to the embodiment is disposed on a base plate 2 of a package that houses a power module. The semiconductor device 1 includes four-divided insulating plates 3 to 6, conductive patterns 7 to 10 provided on main surfaces of the insulating plates 3 to 6, and IGBT elements 11 to 18 as switching elements disposed on the conductive patterns 7 to 10. With respect to the conductive patterns (primary conductive patterns) 7, 8 on which a plurality of IGBT elements 11 to 14 are connected in parallel on an upper arm, the conductive patterns (primary conductive patterns)9, 10 to which emitter electrodes of the IGBT elements 11 to 14 are connected are the other conductive patterns.

In the embodiment, among the switching elements 11 to 14 belonging to the upper arm, the emitter electrodes of the IGBT elements 12, 13 disposed on the different conductive patterns 7, 8 are directly connected to each other via a conductor wire 19 as a wiring member. Further, among the switching elements 15 to 18 belonging to the lower arm, the emitter electrodes of the IGBT elements 16, 17 disposed on the different conductive patterns 9, 10 are directly connected to each other via a conductor wire 20 as a wiring member. Further, the emitter electrodes of the IGBT elements (11, 12), (13, 14), (15, 16), and (17, 18) disposed on the same conductive patterns (7 to 10) are directly connected to each other via conductor wires 21 to 24 as other wiring members, respectively. In the embodiment, conductor wires are used as the wiring members (19, 20) and the other wiring members (21 to 24). The conductor wires of 10 μm to 600 μm in diameter may be used as the wiring members. As the material of the conductor wire, it is possible to use one of or a combination of gold, copper, aluminum, a gold alloy, a copper alloy, and an aluminum alloy. Further, as the wiring member, it is also possible to use a member other than the conductor wire. For example, a ribbon (10 to 300 μm in thickness, 0.1 to 2.0 mm in width) may be used as the wiring member.

While the four divided insulating plates 3 to 6 are used in the embodiment, the divided number of the insulating plates is not limited thereto, and it is also possible to use a single insulating plate. Further, while two each of IGBT elements (11, 12) to (17, 18) are disposed on each of the conductive patterns 7 to 10, at least one IGBT element may be disposed on a single conductive pattern. Further, the IGBT elements 11 to 18 are connected onto the respective conductive patterns 7 to 10 by using a bonding material such as solder.

On the main surface of the insulating plate 3, a plurality of conductive patterns including the conductive pattern 7 are provided in an island form (being electrically insulated from each other). The conductive pattern 7 is provided in a main area in the center part of the main surface of the insulating plate 3. Another conductive pattern (secondary conductive pattern, output pattern) 31 is provided in a space formed by cutting out a part of the conductive pattern 7 on the insulating plate 5 side (lower arm side). In the peripheral edge of the main surface of the insulating plate 3, a plurality of conductive patterns 32 to 35 are provided to surround the conductive patterns 7 and 31. In the conductive pattern 7, there is provided a first terminal region 36 that is connected to an input terminal (P) on a high potential side of the power module. The two IGBT elements 11, 12 disposed on the conductive pattern 7 are disposed such as to connect the collector electrodes to the conductive pattern 7. Further, two free wheeling diodes 37, 38 are disposed by neighboring to the two IGBT elements 11, 12 on the conductive pattern 7. The two free wheeling diodes 37, 38 are disposed such as to connect cathode electrodes to the conductive pattern 7. Thereby, the free wheeling diodes 37, 38 are connected in reverse-parallel to the two IGBT elements 11, 12, and the collector electrodes of the IGBT elements 11, 12 and the cathode electrodes of the free wheeling diodes 37, 38 are electrically connected to the first terminal region 36 (input terminal (P) on the high potential side).

As described above, on the main surface of the other insulating plate 4, the IGBT elements 13, 14 connected in parallel to the IGBT elements 11, 12 are disposed. On the main surface of the insulating plate 4, a plurality of conductive patterns 8 and the like as well as a first terminal region 39 are provided in the same arrangement as that of the plurality of conductive patterns 7, 31 to 35, and the first terminal region 36 disposed on the main surface of the insulating plate 3. The two IGBT elements 13, 14 disposed on the conductive pattern 8 are disposed such as to connect collector electrodes to the conductive pattern 8, and free wheeling diodes 40, 41 are disposed such as to connect cathode electrodes to the conductive pattern 8. Thereby, the free wheeling diodes 40, 41 are connected in reverse-parallel to the two IGBT elements 13, 14, and the collector electrodes of the IGBT elements 13, 14 and the cathode electrodes of the free wheeling diodes 40, 41 are electrically connected to the first terminal region 39 (input terminal (P)).

Further, insulating plates 51, 52 are disposed adjacent to the insulating plates 3, 4 on the base plate 2. On the top surface of the insulating plate 51, conductive patterns 53, 54 are provided. In the conductive pattern 53, a connection terminal 57 is provided at a connecting position of gate terminals of the lower arm (IGBT elements 15 to 18). In the conductive pattern 54, a connection terminal 58 is provided at a connecting position of sense emitter terminals of the lower arm (IGBT elements 15 to 18). Further, conductive patterns 55, 56 are provided on the top surface of the other insulating plate 52. In the conductive pattern 55, a connection terminal 59 is provided at a connecting position of gate terminals of the upper arm (IGBT elements 11 to 14). In the conductive pattern 56, a connection terminal 60 is provided at a connecting position of sense emitter terminals of the upper arm (IGBT elements 11 to 14).

In the meantime, another insulating plate 5 is disposed by neighboring to the insulating plate 3 on the base plate 2, and another insulating plate 6 is disposed by neighboring to the insulating plate 4. The conductive pattern 9 is provided on the main surface of the insulating plate 5. In the conductive pattern 9, a second terminal region 61 connected to an output terminal (O) of the power module is provided. Further, the conductive pattern 10 is provided on the main surface of the insulating plate 6 that is disposed by neighboring to the insulating plate 4, and a second terminal region 62 connected to the output terminal (O) of the power module is provided in the conductive pattern 10.

The emitter electrodes of the two IGBT elements 11, 12 provided on the conductive pattern 7 of the upper arm are connected to the respective anode electrodes of the neighboring free wheeling diodes 37, 38 via conductor wires W11, and further connected to the conductive pattern 31 via conductor wires W12. The conductive pattern 31 is connected to the conductive pattern 9 on the neighboring insulating plate 5 via conductor wires W13. The second terminal region 61 is connected to the conductive pattern 9, so that the emitter electrodes of the two IGBT elements 11, 12 are electrically connected to the second terminal region 61.

As in the case of the IGBT elements 11, 12, the emitter electrodes of the two IGBT elements 13, 14 provided on the other conductive pattern 8 of the upper arm are connected to the respective anode electrodes of the neighboring free wheeling diodes 40, 41 via conductor wires, and further connected to the conductive pattern on the neighboring insulating plate 6 via conductor wires and conductive patterns. The second terminal region 62 is connected to the conductive pattern 10, so that the emitter electrodes of the two IGBT elements 13, 14 are electrically connected to the second terminal region 62.

The insulating plate 5 of the lower arm is disposed by neighboring to the insulating plate 3 in a direction orthogonal to the array direction of the four IGBT elements 11 to 14 of the upper arm (the array direction is the direction in which the semiconductor elements, here the four IGBT elements 11 to 14, are arranged in a line). On the main surface of the insulating plate 5, the IGBT elements 15, 16, a plurality of conductive patterns 9, 71 to 75, and the free wheeling diodes 76, 77 are disposed at line symmetry positions of the plurality of conductive patterns 7, 31 to 35, and the free wheeling diodes 37, 38 disposed on the main surface of the insulating plate 3. Further, in the conductive pattern (secondary conductive pattern, output pattern) 71 to which the emitter electrodes of the IGBT elements 15, 16 are connected in common, a third terminal region 81 connected to an input terminal (N) on a low potential side of the power module is provided. In this specification, conductive patterns such as conductive patterns 7-10 on which switching elements are disposed may also be referred to as primary conductive patterns. Conductive patterns such as conductive patterns 71-75 on which switching elements are not disposed (i.e., all conductive patterns other than primary conductive patterns) may also be referred to as secondary conductive patterns. Further, conductive patterns such as conductive patterns 31 and 71 to which the conductor wires W12 and W22 (first main current wiring member) is connected, among the secondary conductive patterns, may also be referred to as output patterns.

The emitter electrodes of the two IGBT elements 15, 16 disposed on the conductive pattern 9 are connected to the respective anode electrodes of the neighboring free wheeling diodes 76, 77 via conductor wires W21, and further connected to the conductive pattern 71 via conductor wires W22. The conductive pattern 71 is connected to a third terminal region 81 that is connected to an input terminal (N) on a low potential side.

In the meantime, on the main surface of the insulating plate 6, the IGBT elements 17, 18 connected in parallel to the IGBT elements 15, 16 are disposed. On the main surface of the insulating plate 6, a plurality of conductive patterns 10 and the like as well as the second terminal region 62 are provided in the same arrangement as that of the plurality of conductive patterns 9, 71 to 75 and the second terminal region 61 disposed on the main surface of the insulating plate 5. The two IGBT elements 17, 18 disposed on the conductive pattern 10 are disposed such as to connect the collector electrodes to the conductive pattern 10, and free wheeling diodes 78, 79 are disposed such as to connect cathode electrodes to the conductive pattern 10. Thereby, the free wheeling diodes 78, 79 are connected in reverse-parallel to the two IGBT elements 17, 18, and the collector electrodes of the IGBT elements 17, 18 and the cathode electrodes of the free wheeling diodes 78, 79 are electrically connected to the second terminal region 62 (output terminal (O)).

As in the case of the IGBT elements 15, 16, the emitter electrodes of the two IGBT elements 17, 18 provided on the conductive pattern 10 are connected to the respective anode electrodes of the neighboring free wheeling diodes 78, 79 via conductor wires, and further electrically connected to a third terminal region 82 as an input terminal (N) on a low potential side via conductor wires and conductive patterns.

Figure 2:
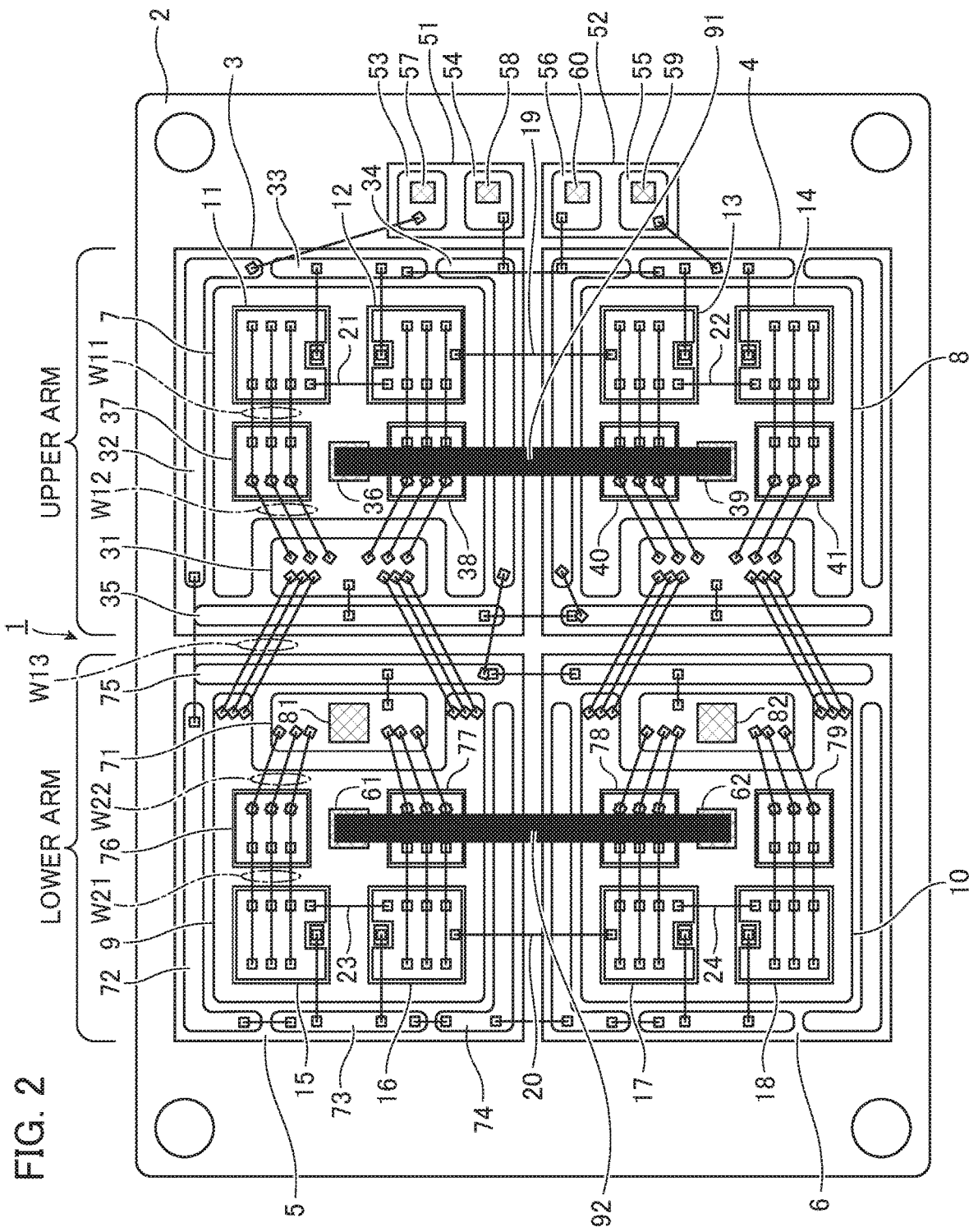
FIG. 2 is a plan view showing a relative relation of lead frames connecting between a switching element array and an output terminal in an upper arm.

Next, by referring to FIG. 2, FIG. 3, and FIG. 4, there will be described connection structures between the terminal regions regarding the first terminal regions 36, 39 disposed on the different conductive patterns in the upper arm as well as the second terminal regions 61, 62 and the third terminal regions 81, 82 disposed on the different conductive patterns in the lower arm. FIG. 2 shows the connection structure between the first terminal regions 36 and 39 in the upper arm. In the upper arm, a first lead frame 91 is placed between the first terminal region 36 provided on the conductive pattern 7 and the first terminal region 39 provided on the other conductive pattern 8. FIG. 4A to FIG. 4C show structural examples of the lead frame. Note that a second lead frame and a third lead frame have the similar structures, so that the second lead frame and the third lead frame will also be described by using FIG. 4A to FIG. 4C. The first lead frame 91, as shown in FIG. 4A, includes two first leg parts 101-1 connected, respectively, to the first terminal regions 36, 39, a first connection part 102-1 connected to outside, and a first wiring part 103-1 connecting the first leg parts 101-1 and the first connection part 102-1. While the first connection part 102-1 is projected upward from the first wiring part 103-1 in the structural example shown in FIG. 4A, it is not essential to be projected from the first wiring part 103-1 as illustrated in FIG. 4B. Further, the first wiring part 103-1 is not limited to be in a portal shape but, as illustrated in FIG. 4C, a branch part 104-1 branched in an L-letter shape may be formed and the first connection part 102-1 may be provided in the vicinity of the tip of the branch part 104-1. The first lead frame 91 is not limited to the structures of FIG. 4A to FIG. 4C, but modifications are possible as appropriate. The first lead frame 91 is disposed in parallel to the conductor wires 19, 21, and 22 that connect the emitter electrodes of the IGBT elements 11 to 14 in the upper arm. The first lead frame 91 has electrical conductivity for electrically connecting between the first terminal regions 36 and 39, and also has mechanical strength for supporting external bus bars and the like. As a lead frame material excellent in the electrical conductivity and mechanical strength, it is possible to use a metal material such as a copper material, a copper alloy material, an aluminum alloy material, or an iron alloy material.

In the embodiment, the second terminal regions 61, 62 (output terminals O) to which the emitter electrodes of the IGBT elements 11 to 14 belonging to the upper arm are connected are provided in the conductive patterns 9, 10 on the lower arm side. Further, in the lower arm, the second lead frame 92 is placed between the second terminal region 61 provided in the conductive pattern 9 and the second terminal region 62 provided in the other conductive pattern 10. The second lead frame 92 has one of the structures shown in FIG. 4A to FIG. 4C. That is, the second lead frame 92 includes two second leg parts 101-2 connected, respectively, to the second terminal regions 61, 62, a second connection part 102-2 connected to outside, and a second wiring part 103-2 connecting between the second leg parts 101-2 and the second connection part 102-2. In the case of the structure shown in FIG. 4C, a branch part 104-2 is provided. The second lead frame 92 is disposed in parallel to the conductor wires 19, 21, and 22 that connect the emitter electrodes of the IGBT elements 11 to 14 in the upper arm. The second lead frame 92 has electrical conductivity for electrically connecting between the second terminal regions 61 and 62, and also has prescribed mechanical strength. Further, on the substrates, the first lead frame 91 and the second lead frame 92 are disposed in parallel.

Figure 3:
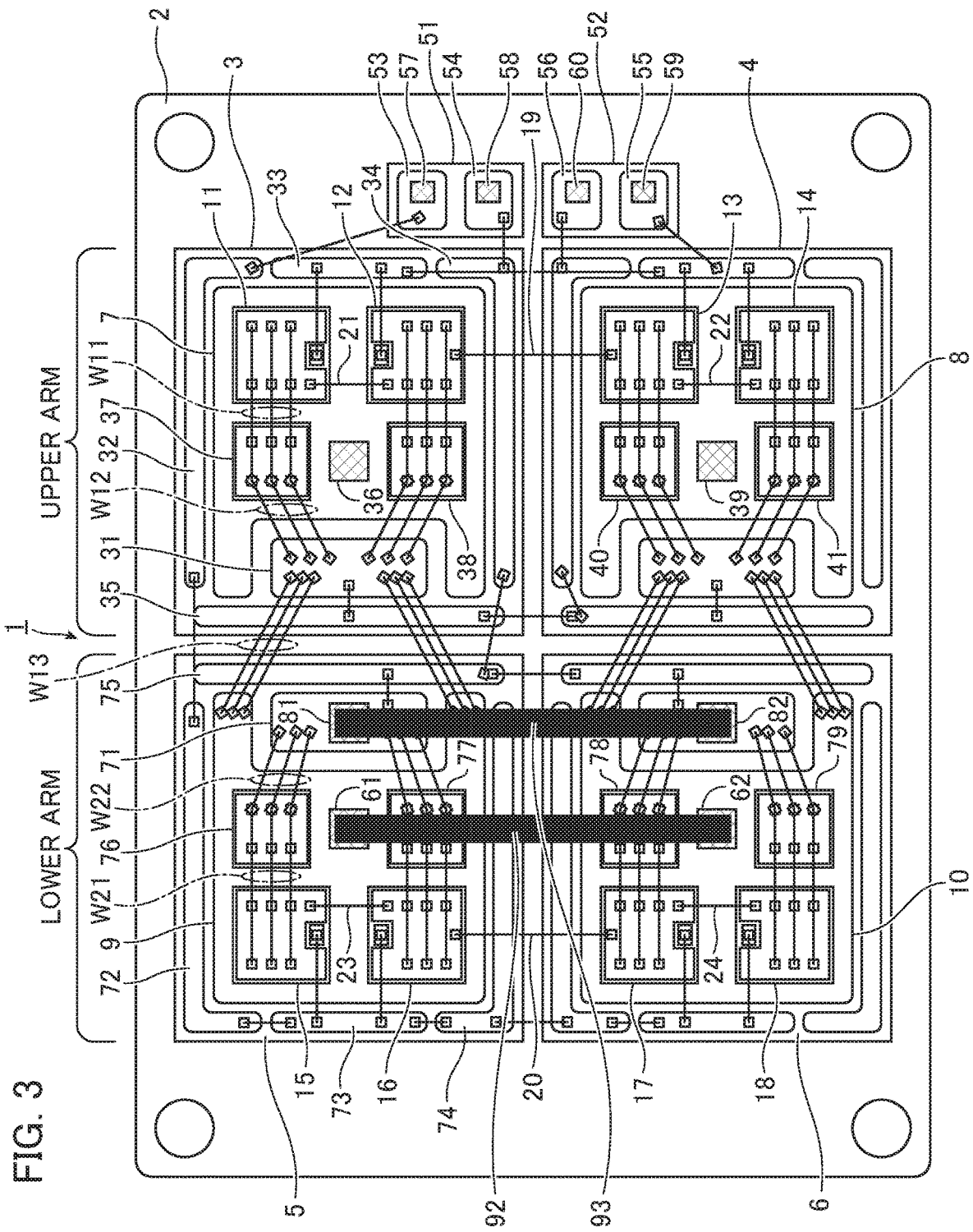
FIG. 3 is a plan view showing a relative relation of lead frames connecting between a switching element array and an output terminal in a lower arm.
Figure 4A:
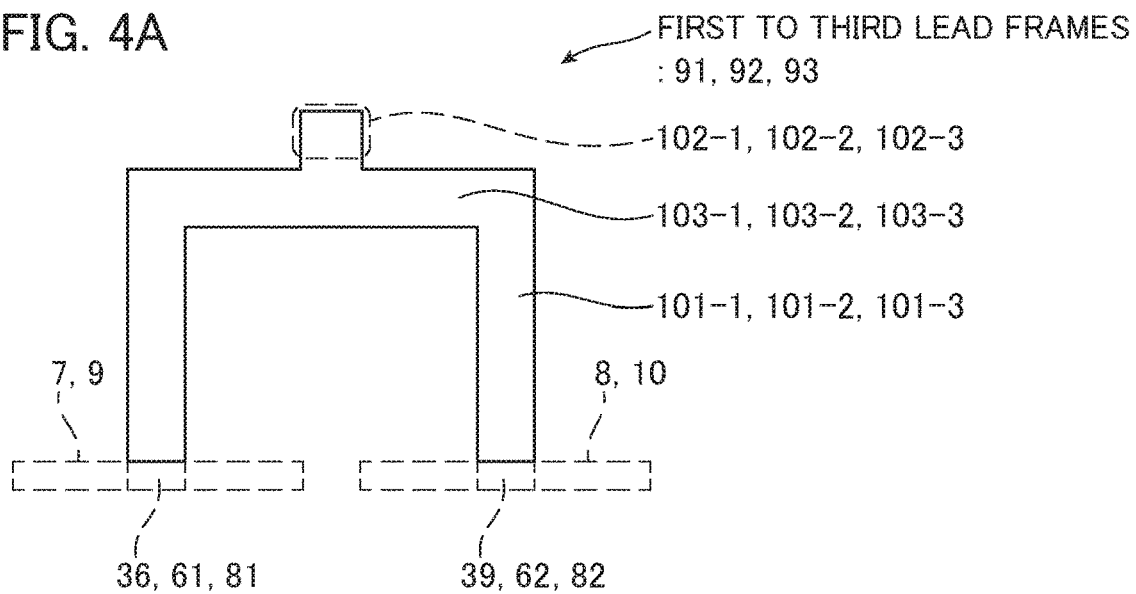
FIG. 4A is a diagram showing a structural example of the lead frame.
Figure 4B:
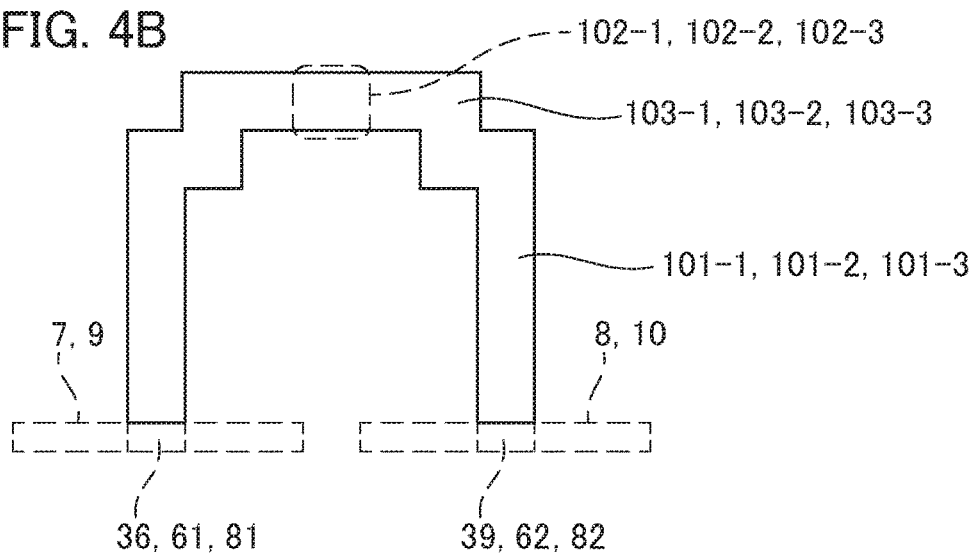
FIG. 4B is a diagram showing another structural example of the lead frame.
Figure 4C:
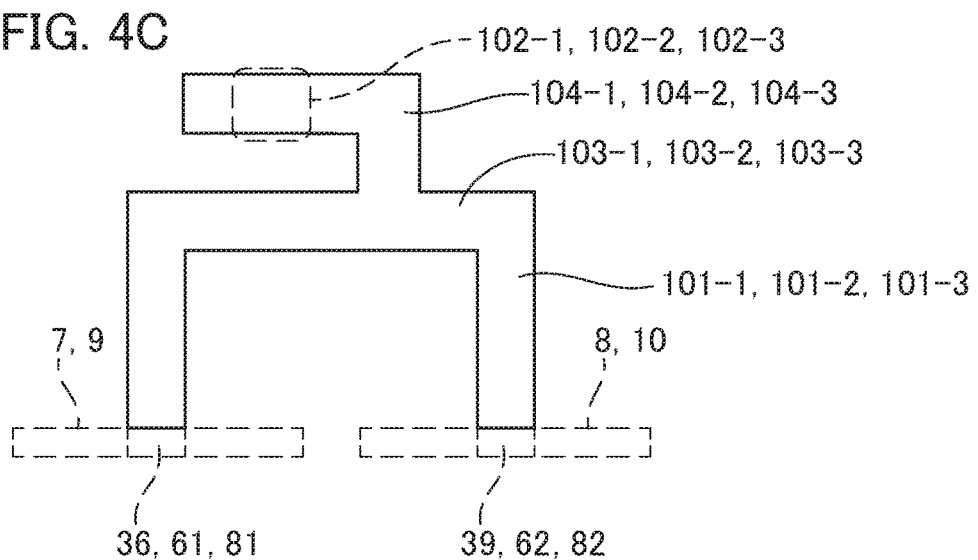
FIG. 4C is a diagram showing still another structural example of the lead frame.

FIG. 3 shows the connection structures between the second terminal regions 61, 62 and between the third terminal regions 81, 82 in the lower arm. As described above, the second terminals 61 and 62 are connected via the second lead frame 92. The third lead frame 93 is placed between the third terminal region 81 and the other third terminal region 82. The third lead frame 93 has one of the structures shown in FIG. 4A to FIG. 4C. That is, the third lead frame 93 includes two third leg parts 101-3 connected, respectively, to the third terminal regions 81, 82, a third connection part 102-3 connected to outside, and a third wiring part 103-3 connecting between the third leg parts 101-3 and the third connection part 102-3. In the case of the structure shown in FIG. 4C, a branch part 104-3 is provided. The third lead frame 93 has electrical conductivity for electrically connecting between the third terminal regions 81 and 82, and also has prescribed mechanical strength.

As described above, in the embodiment, the array direction of the switching elements 11 to 14 belonging to the upper arm and the wiring direction of the conductor wire 19 as the wiring member are the same direction (the wiring direction is the direction in which a conductor wire extends). Further, the wiring direction of the conductor wire 19 as the wiring member and the wiring direction of the conductor wires 21, 22 as the other wiring members are the same direction. Further, the array direction of the switching elements 11 to 14, the wiring direction of the conductor wire 19 as the wiring member, the array direction of the first terminal regions 36, 39, and the array direction of the second terminal regions 61, 62 are the same direction. Further, from the side closer to the array of the switching elements 11 to 14, the wiring of the conductor wire 19 as the wiring member, the array of the first terminal regions 36, 39, and the array of the second terminal regions 61, 62 are disposed in this order.

Figure 5:
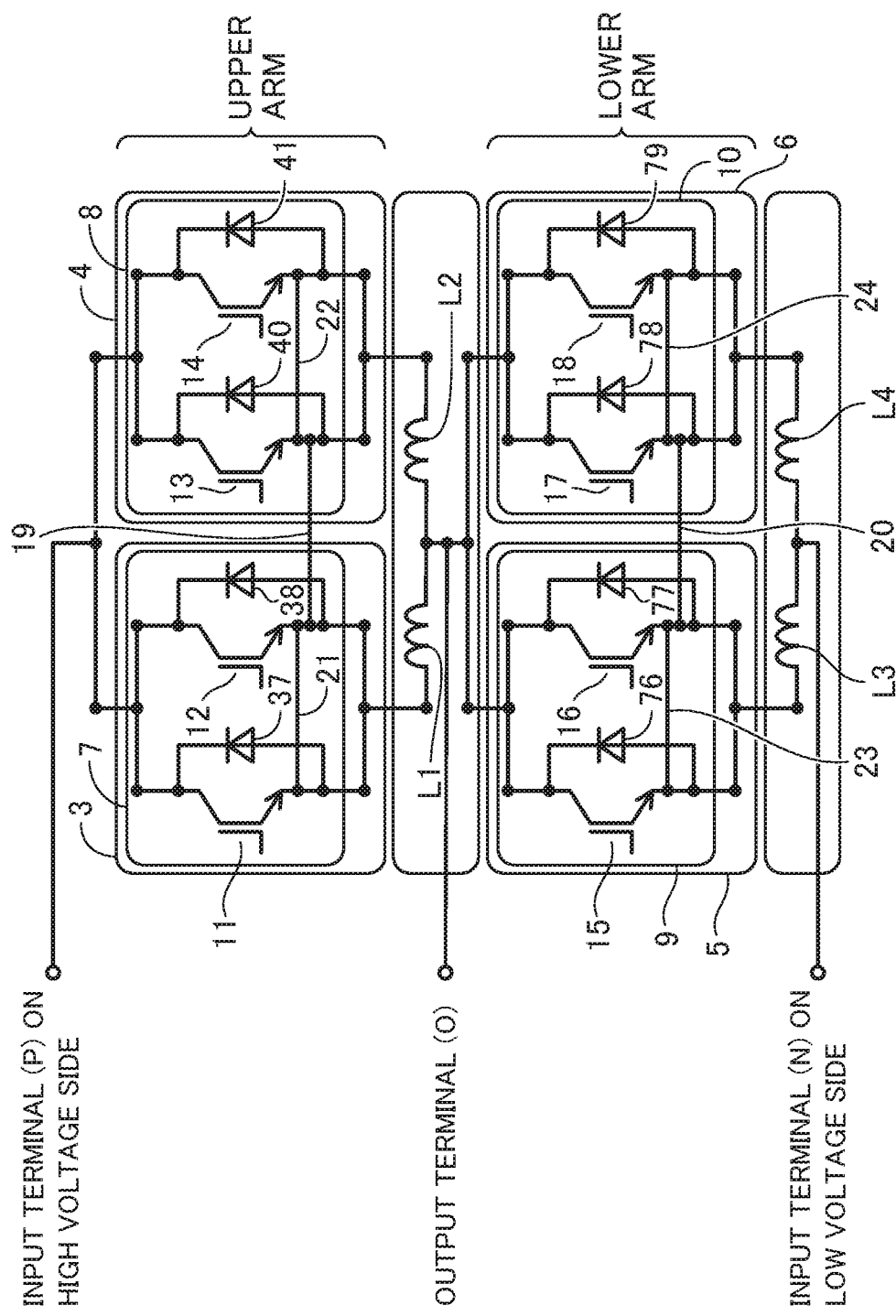
FIG. 5 is a circuit diagram showing a case where the semiconductor device according to the embodiment is applied to a power module.

FIG. 5 shows a circuit diagram of the semiconductor device 1 shown in FIG. 1 to FIG. 3.

The semiconductor device 1 is configured with the upper arm and the lower arm. The four IGBT elements 11 to 14 belong to the upper arm, and those IGBT elements 11 to 14 are connected in parallel to each other. In the upper arm, the IGBT elements 11, 12 disposed on one (insulating plate 3) of the substrates are connected in parallel on the same conductive pattern 7, and the free wheeling diodes 37, 38 are connected in reverse-parallel to the IGBT elements 11, 12. Similarly, the IGBT elements 13, 14 disposed on the other substrate (insulating plate 4) are connected in parallel on the same conductive pattern 8, and the free wheeling diodes 40, 41 are connected in reverse-parallel to the IGBT elements 13, 14. To the common connection point (first terminal region 36) of the collector electrodes of the IGBT elements 11, 12 on the conductive pattern 7 and the common connection point (first terminal region 39) of the collector electrodes of the IGBT elements 13, 14 on the other conductive pattern 8, the input terminal (P) on the high potential side is connected. The input terminal (P) is branched and connected to the first terminal regions 36, 39 via the first lead frame 91 (see FIG. 2). To the common connection point (second terminal region 61) of the emitter electrodes of the IGBT elements 11, 12 on the conductive pattern 7 and the common connection point (second terminal region 62) of the emitter electrodes of the IGBT elements 13, 14 on the other substrate (conductive pattern 8), the output terminal (O) is connected. The output terminal (O) is branched and connected to the second terminal regions 61, 62 via the second lead frame 92 (see FIG. 2).

Further, in the embodiment, as oscillation measures, the emitter electrodes of the IGBT element 12 disposed on the conductive pattern 7 and the IGBT element 13 disposed on the other conductive pattern 8 are directly connected to each other via the conductor wire 19. The IGBT element 12, out of the IGBT elements (11, 12) disposed on the conductive pattern 7, is disposed at a position closest to the other conductive pattern 8. The other IGBT element 13, out of the IGBT elements (13, 14) disposed on the conductive pattern 8, is disposed at a position closest to the other conductive pattern 7. Therefore, it is possible to say that a set of switching elements connected via the conductor wire 19 is a combination of the switching elements with which the length of the conductor wire 19 becomes the shortest among the plurality of switching elements disposed on the different conductive patterns. Further, in the embodiment, as the oscillation measures, the emitter electrodes of the IGBT elements 11 and 12 disposed on the same conductive pattern 7 and connected in parallel are also directly connected via the conductor wire 21. Further, the emitter electrodes of the IGBT elements 13 and 14 disposed on the other conductive pattern 8 and connected in parallel are also directly connected via the conductor wire 22 (see FIG. 3).

The lower arm has the four IGBT elements 15 to 18 belonging thereto, and has basically the similar circuit configuration as that of the upper arm. The major different point from the circuit configuration of the upper arm is that the common connection points (second terminal regions 61, 62) of the collector electrodes of the IGBT elements 15 to 18 are connected to the output terminal (O), and the input terminal (N) on a low potential side is connected to the common connection points (third terminal regions 81, 82) of the emitter electrodes of the IGBT elements 15 to 18. The input terminal (N) is branched and connected to the third terminal regions 81, 82 via the third lead frame 93.

In the lower arm, the similar oscillation measures as those of the upper arm are taken. The emitter electrodes of the IGBT element 16 disposed on the conductive pattern 9 and the IGBT element 17 disposed on the other conductive pattern 10 are directly connected to each other via the conductor wire 20. Further, the emitter electrodes of the IGBT elements 15 and 16 disposed on the same conductive pattern 9 and connected in parallel are also directly connected via the conductor wire 23. Further, the emitter electrodes of the IGBT elements 17 and 18 disposed on the other conductive pattern 10 and connected in parallel are also directly connected via the conductor wire 24.

As described above, the emitter electrodes of the IGBT elements 11 and 12 belonging to the upper arm are connected in the conductive pattern 9 (second terminal region 61) provided in the lower arm. In the circuit diagram shown in FIG. 5, the inductance between the emitter electrodes of the IGBT elements 11 and 12 is illustrated as L1. Similarly, the inductance between the emitter electrodes of the IGBT elements 13 and 14 belonging to the upper arm is illustrated as L2. Further, the inductance between the emitter electrodes of the IGBT elements 15, 16 belonging to the lower arm is illustrated as L3, and the inductance between the emitter electrodes of the IGBT elements 17, 18 is illustrated as L4.

In the semiconductor device 1 configured in the manner described above, a high-potential voltage from the input terminal (P) is branched and applied to the first terminal regions 36, 39 via the first lead frame 91, and a low-potential voltage from the input terminal (N) is branched and applied to the third terminal regions 81, 82 via the third lead frame 93. Then, a control voltage is applied to the gate terminals of the IGBT elements 11 to 14 belonging to the upper arm via the connection terminal 59 to simultaneously on-off operate the IGBT elements 11 to 14 belonging to the upper arm. In the meantime, a control voltage is applied from the connection terminal 57 to the gate terminals of the IGBT elements 15 to 18 belonging to the IGBT elements 15 to 18 to simultaneously on-off operate the IGBT elements 15 to 18 belonging to the lower arm. The timing of the on-off operations of the upper arm and the lower arm is controlled to operate such that a prescribed power waveform is generated in the second terminal regions 61, 62.

The oscillation measures according to the embodiment will be described in a specific manner.

Figure 6:
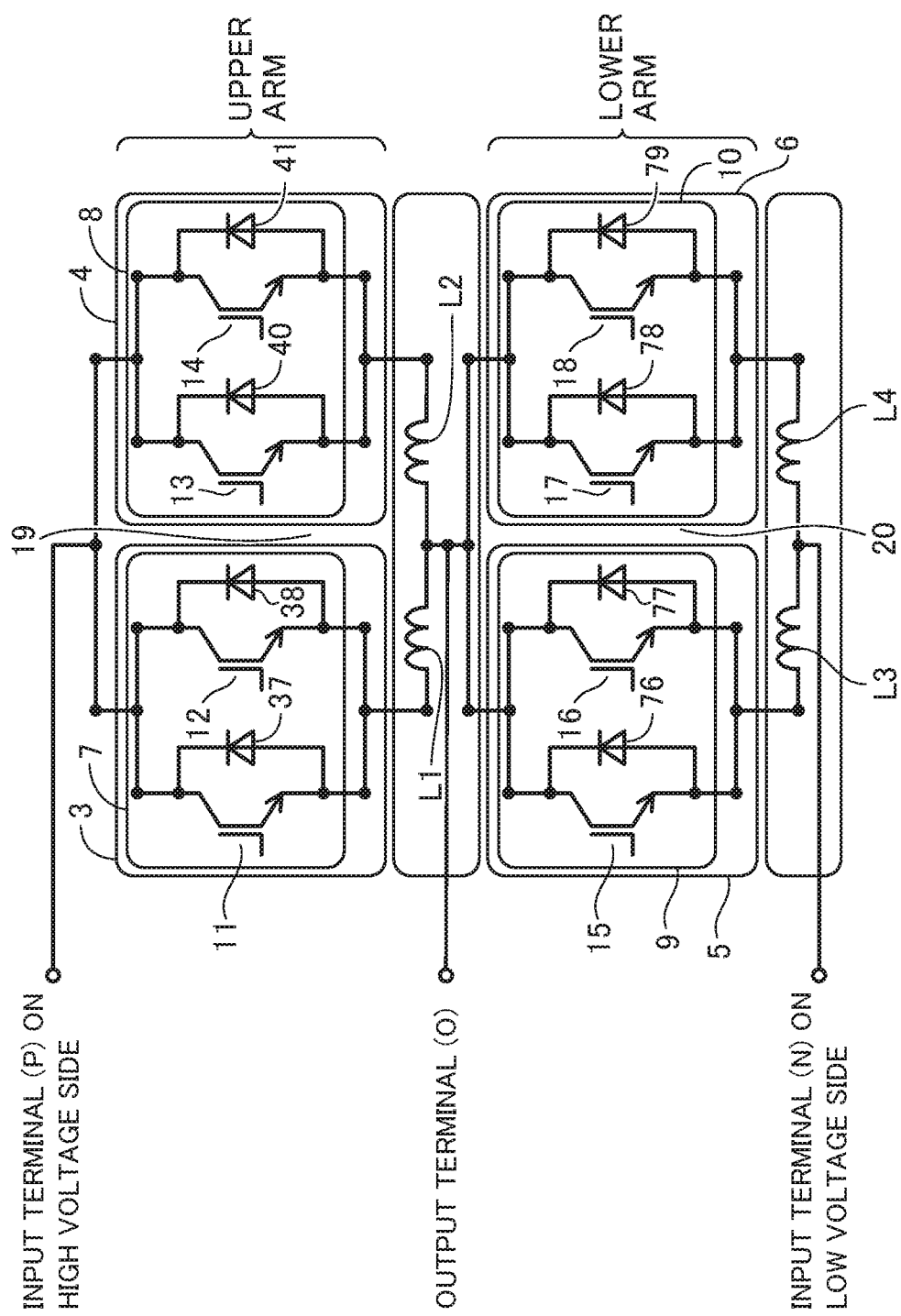
FIG. 6 is a circuit diagram showing a case where a semiconductor device with no measures taken for oscillation is applied to a power module.

First, there will be examined a configuration (case without taking measures) in which the conductor wire 19 and the conductor wires 21, 22 connecting between the emitter electrodes of the IGBT elements 11 to 14 belonging to the upper arm are not provided. FIG. 6 is a circuit block diagram corresponding to the case without taking measures. In this circuit diagram, reference numerals applied to each of the structural components correspond to the reference numerals applied in the circuit configuration shown in FIG. 5. In this case, the emitter electrodes of the two IGBT elements 11, 12 disposed on the same conductive pattern 7 are connected to each other via the conductor wires W11, the anode electrodes of the free wheeling diodes 37, 38, the conductor wires W12, the conductive pattern 31, the conductor wires W13, and the conductive pattern 9 as well as the first terminal region 81 on another substrate. Therefore, the inductance L1 between the emitter electrodes of the two IGBT elements 11 and 12 is considered to have a large inductance value configured with the inductance components of the paths interposed from the emitter electrodes to the first terminal region 81. Similarly, the inductance L2 between the emitter electrodes of the two IGBT elements 13 and 14 disposed on the other conductive pattern 8 is also considered to have a similarly large inductance value as that of the inductance L1.

Figure 7A:
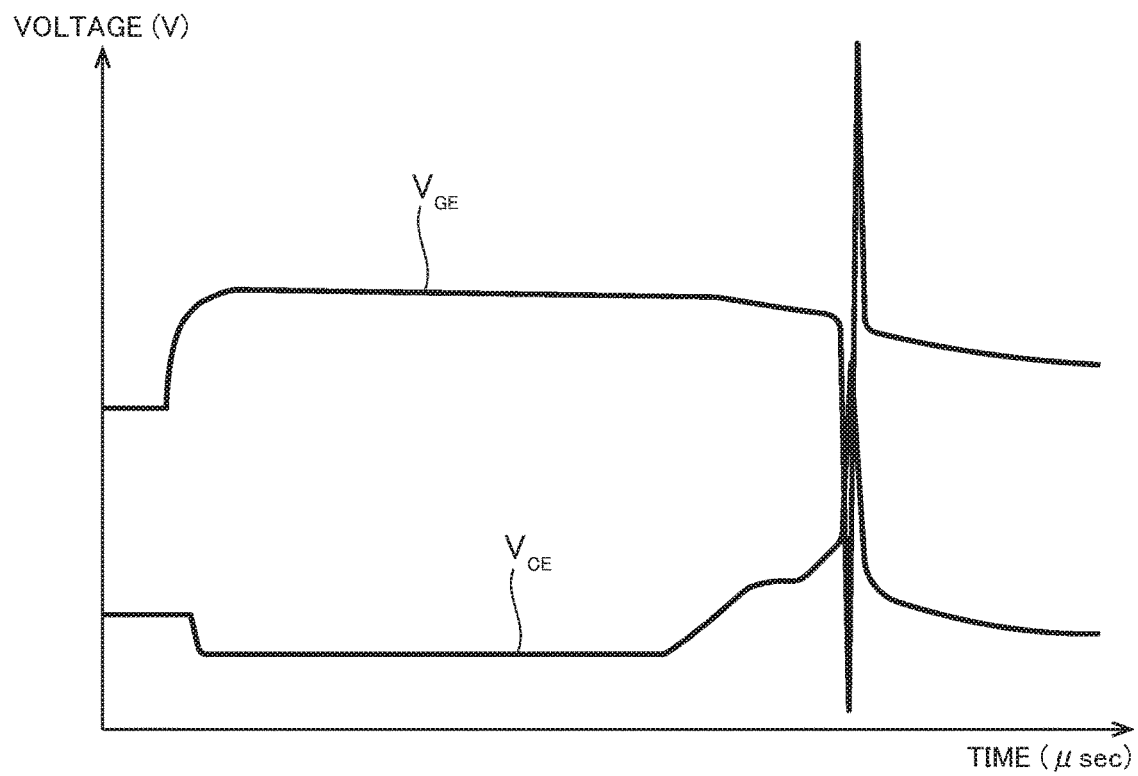
FIG. 7A is a waveform chart of a case where no measure is taken for wire connection between emitters of IGBT elements.

FIG. 7A shows a measurement result of operation waveforms in the case where no oscillation measure is taken. Specifically, shown is the result where the supply voltage was set to 100 V in a model circuit where the conductor wires 19, 21, and 22 were not provided in the module structure shown in FIG. 1. As shown in FIG. 7A, it was verified that, in tuning off, the potential $V_{GE}$ between the gates and emitters and the potential $V_{CE}$ between the collectors and emitters of the IGBT elements 11 to 14 largely increase instantly.

Here, there will be examined a case where the emitter electrodes of the IGBT elements 11, 12 (13, 14) that are disposed on the same conductive pattern 7 (8) and connected in parallel are connected to each other via the conductor wire 21 (22) while the emitter electrodes of the IGBT element 12 and the IGBT element 13 disposed on the different conductive patterns 7, 8 are not connected via the conductor wire 19. Since the emitter electrodes of the IGBT elements 11, 12 (13, 14) that are disposed on the same conductive pattern 7 (8) and connected in parallel are connected to each other via the conductor wire 21 (22), the potentials between the emitter electrodes of the IGBT elements 11, 12 (13, 14) connected in parallel on the same conductive pattern 7 (8) are made uniform. Thereby, concerning the IGBT elements 11, 12 (13, 14) that are disposed on the same conductive pattern 7 (8) and connected in parallel, an oscillation suppressing effect can be expected to some extent.

In the meantime, the IGBT elements 11, 12 and the IGBT elements 13, 14 disposed on the different conductive patterns 7, 8 in the upper arm are also connected in parallel. In the case where the conductor wire 19 is not provided, the emitter electrodes between the IGBT elements 11, 12 and the IGBT elements 13, 14 disposed on the different conductive patterns 7, 8 are electrically connected via the second lead frame 92 (see FIG. 2) that connects between the second terminal regions 61, 62 of the lower arm located at a distance. Therefore, the emitter electrodes between the IGBT elements 11, 12 and the IGBT elements 13, 14 disposed on the different conductive patterns 7, 8 are electrically connected via a large inductance.

Thus, in the embodiment, in the upper arm, the emitter electrodes of the IGBT element 12 and the IGBT element 13 disposed on the different conductive patterns 7, 8 at a short distance are electrically connected via the conductor wire 19. Thereby, the potentials between the emitter electrodes of the IGBT element 12 and the IGBT element 13 disposed on the different conductive pattern 7, 8 are made uniform, so that a great improvement in the oscillation suppressing effect can be expected. Further, in the lower arm, the emitter electrodes of the IGBT element 16 and the IGBT element 17 disposed on the different conductive patterns 9, 10 at a short distance are electrically connected via the conductor wire 20. In the lower arm, the emitter electrodes of the IGBT elements 15, 16 and the IGBT elements 17, 18 disposed on the different conductive patterns 9, 10 are connected via the third lead frame 93 disposed within the same arm. Therefore, compared to the upper arm, the inductance between the emitter electrodes of the IGBT elements 15, 16 and the IGBT elements 17, 18 disposed on the different conductive patterns 9, 10 becomes smaller. However, by directly connecting between the electrodes of the emitter electrodes of the IGBT element 16 and the IGBT element 17 via the conductor wire 20, a large oscillation suppressing effect similar to that of the upper arm can be expected.

Figure 7B:
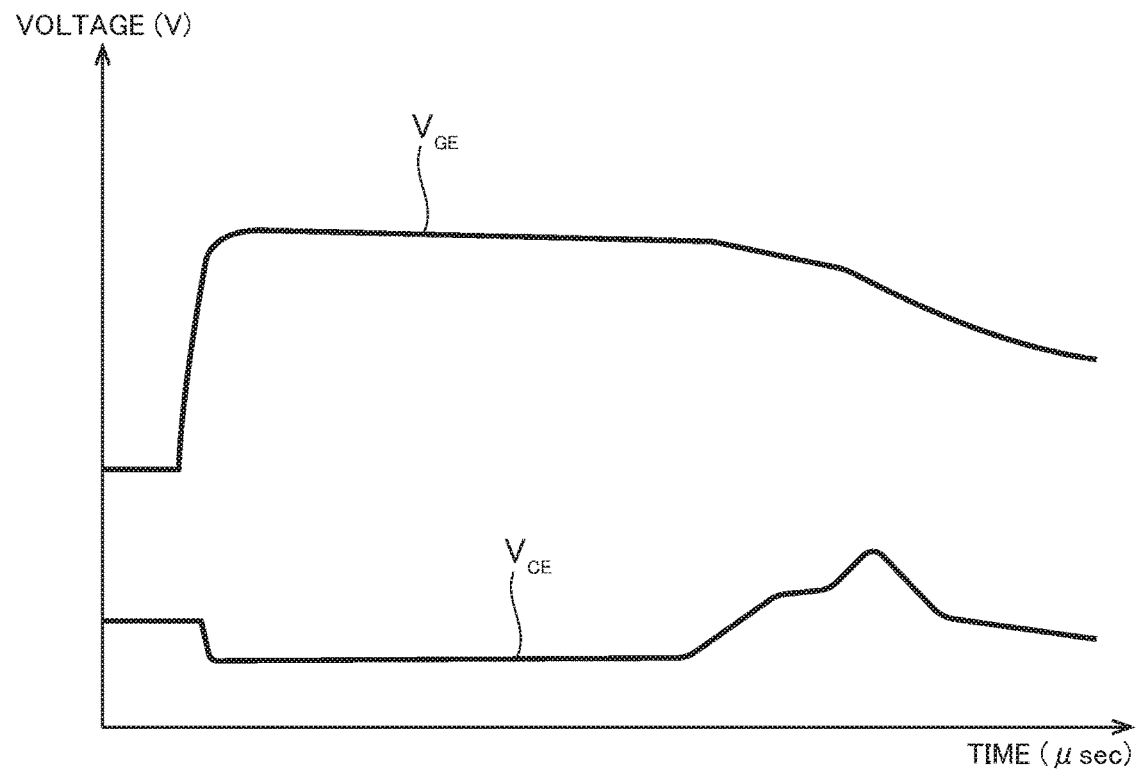
FIG. 7B is a waveform chart of the embodiment where measures are taken for wire connection between the emitters of the IGBT elements.

FIG. 7B shows a measurement result of operation waveforms of the embodiment (FIG. 1). The same components as model circuits of FIG. 7A are used other than the conductor wires 19, 21, and 22 as the oscillation measures. As shown in FIG. 7B, it was verified that there is no oscillation in the potentials between the gates and emitters of the IGBT elements 11 to 14 as well as the potentials between the collectors and the emitters.

Note that the present invention is not limited to the embodiment described above but may be performed by applying various modifications. Dimensions, shapes, directions, and the like described in the embodiment are not limited to those illustrated in the accompanying drawings, but it is possible to apply various modifications as appropriate within the scope with which the effects of the present invention can be achieved. Further, it is also possible to apply modifications as appropriate without departing from the scope of the object of the present invention.

In the embodiments described above, the four divided substrates (insulating plates 3 to 6, conductive patterns 7 to 10) are disposed on top-and-bottom and left-and-right directions, and it is also possible to employ a configuration where those are disposed in one direction. Further, the number of switching elements disposed on the same conductive patterns 7 to 10 is not specifically limited. Further, while the emitter electrodes of the IGBT element 12 and the IGBT element 13 disposed on the different conductive patterns 7, 8 at the shortest distance are electrically connected via the conductor wire 19 in the embodiment described above, the wiring structure is not limited thereto. The emitter electrodes of the IGBT elements disposed on the different conductive patterns 7, 8 may only need to be directly connected via the conductor wire. For example, the emitter electrodes of the IGBT element 11 and the IGBT element 13 may be connected via the conductor wire or the emitter electrodes of the IGBT element 12 and the IGBT element 14 may be connected via the conductor wire. In the lower arm, the emitter electrodes of the IGBT element 15 and the IGBT element 17 may be connected via the conductor wire or the emitter electrodes of the IGBT element 16 and the IGBT element 18 may be connected via the conductor wire.

Figure 8:
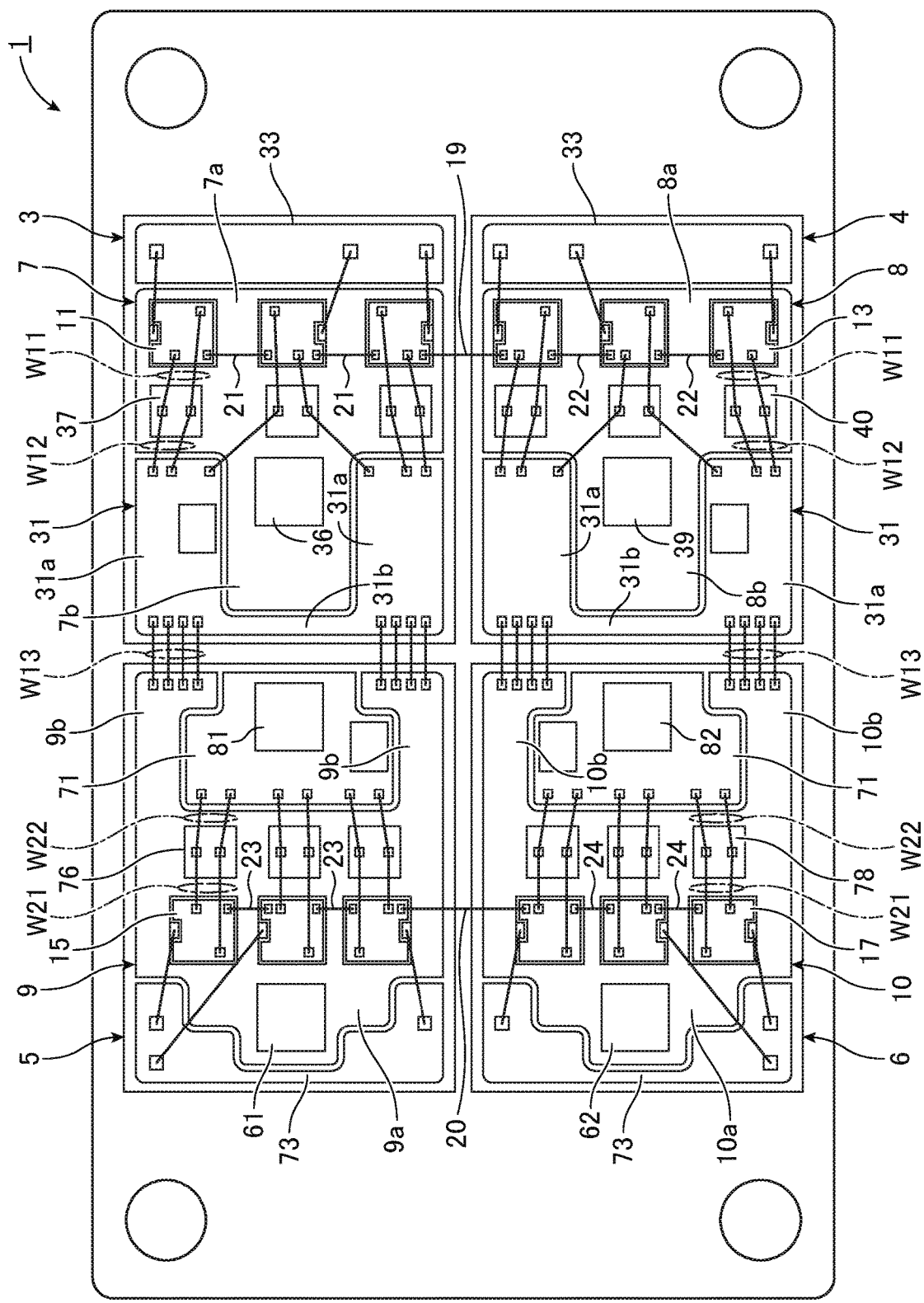
FIG. 8 is a plan view of a semiconductor device according to a second embodiment.
Figure 9:
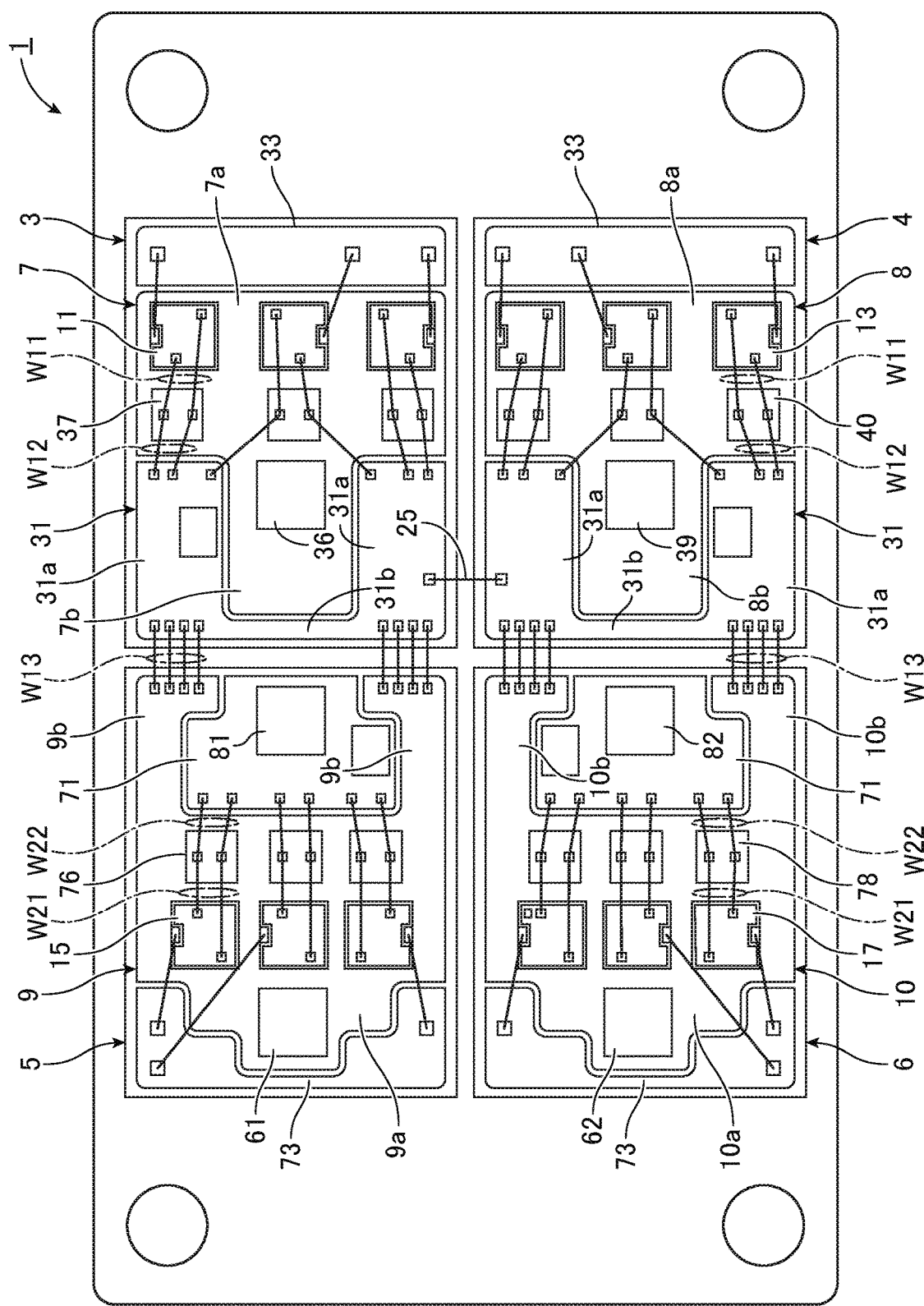
FIG. 9 is a plan view of a semiconductor device according to a modification example of the second embodiment.

Next, by referring to FIG. 8 and FIG. 9, a second embodiment will be described. FIG. 8 is a plan view of a semiconductor device according to the second embodiment. FIG. 9 is a plan view of a semiconductor device according to a modification example of the second embodiment. In the second embodiment, the shapes and layout of a part of conductive patterns, the layout of the switching elements as well as a part of the wiring structure are different from those of the embodiment described above. Therefore, mainly the different points will be described, and same reference numerals are applied to the common components as well as corresponding components and explanations thereof are omitted as appropriate. Further, while two each of the insulating plates are disposed in both the upper arm and the lower arm in FIG. 8 and FIG. 9, layout of the various structural members on each of the insulating plates is common, so that reference numerals and explanations are omitted as appropriate.

In the embodiment described above, the emitter electrodes of the switching elements disposed on the different conductive patterns and connected in parallel among the plurality of switching elements are directly connected to each other via the wiring members (conductor wires 19, 20) and the emitter electrodes of the plurality of switching elements disposed on the same conductive pattern are directly connected to each other via other wiring members (conductor wires 21 to 24) to make it possible to decrease the inductance and so as to suppress the oscillation phenomenon at the time of switching operations. That is, it is found to be effective as the oscillation measures to directly wire the emitter electrodes to each other in the layout where a plurality of chips are arranged in a plurality of stages (2 stages×2 substrates in the above example).

By the way, in the embodiment described above, it is necessary to wire the switching elements (IGBT elements 11, 12) arranged in two upper-and-lower stages on the same conductive pattern 7 to the conductive pattern 31 via the wiring members W12 on the upper arm side, and to wire the conductive pattern 13 to the part arranged in two upper-and-lower stages in the right end part of the conductive pattern 9 of the lower arm via the wiring members W13. Thus, the wire length becomes long, thereby causing increase in the on-resistance due to the wiring resistance. Further, since there is the conductive pattern 31 between the P-terminal (first terminal region 36) and the N-terminal (third terminal region 81), the proximity distance between the P-terminal and the N-terminal is limited. This results in interfering reduction in the inductance. That is, there is a room for more improvement in reducing the inductance.

Thus, the inventors of the present invention paid attentions to the layout of the conductive patterns in addition to the above-described wiring structures, and have come to design the present invention. While details are to be described later, in the second embodiment, the P-wiring pattern (conductive pattern 7 corresponding to the collector or drain conductive pattern) on the upper arm side is in a T-letter shape facing sideways, and the M-wiring pattern (conductive pattern 31 corresponding to the emitter or source conductive pattern) is disposed in two upper-and-lower stages (a pair of long parts 31*a*).

In this case, current nonuniformity (unbalance) occurs in the M-wiring pattern of the two upper-and-lower stages, and it is concerned that the oscillation phenomenon is likely to occur. Thus, the inventors of the present invention have designed to further connect the M-wiring pattern of the two upper-and-lower stages via a third wiring member (long part 31*b*) described later. Thereby, the oscillation phenomenon is suppressed. Further, since the M-wiring pattern is formed in a U-letter shape by surrounding a part of the T-letter shaped P-wiring pattern, the P-terminal (first terminal region 36) and the N-terminal (third terminal region 81) can be disposed adjacently, thereby making it possible to suppress the oscillation phenomenon more effectively.

Hereinafter, specific layout of the semiconductor device 1 according to the second embodiment will be described. As shown in FIG. 8, the semiconductor device 1 is disposed on the base plate 2 of a package that houses a power module. The semiconductor device 1 includes the insulating plates 3 to 6 divided into four with two lengthwise and two breadthwise on a plan view, the conductive patterns 7 to 10 provided on the main surfaces of the insulating plates 3 to 6, and the IGBT elements 11 to 18 as switching elements disposed on the conductive patterns 7 to 10, the IGBT elements 11, 13, 15, 17 to be the switching elements disposed on the conductive patterns 7 to 10, and the free wheeling diodes 37, 40, 76, 78 that are in pairs with the IGBT elements 11, 13, 15, 17 and disposed on the conductive patterns 7 to 10.

The insulating plates 3, 4 side located on the right side when facing FIG. 8 configure the upper arm, and the insulating plates 5, 6 side located on the left side when facing FIG. 8 configure the lower arm. That is, the upper arm and the lower arm are disposed side by side in the left-and-right direction when facing FIG. 8. Further, the insulating plates 3, 4 configuring the upper arm are disposed side by side in the direction (top-and-bottom direction in FIG. 8) orthogonal to the arranged direction (left-and-right direction) of the upper and lower arms. Similarly, the insulating plates 5, 6 configuring the lower arm are disposed side by side in the direction orthogonal to the arranged direction of the upper and lower arms.

Note that three each of the IGBT elements and free wheeling diodes are disposed on each of the insulating plates, and same reference numerals are applied thereto for each of the insulating plates for the sake of explanation. Further, in each of the insulating plates, the IGBT element and the free wheeling diode as a pair are disposed side by side along the arranged direction (left-and-right direction) of the upper and lower arms. Further, a plurality of (three) IGBT elements are disposed side by side along the arranged direction (top-and-bottom direction) of the insulating plates 7, 8. Similarly, a plurality of (three) free wheeling diodes are also disposed side by side along the arranged direction (top-and-bottom direction) of the insulating plates 7, 8. The lower arm is in the similar layout, so that explanation thereof is omitted.

On the main surface of the insulating plate 3, a plurality of conductive patterns (7, 31, 33) including the conductive pattern 7 (first conductive pattern) are provided in an island form (being electrically insulated from each other). The conductive pattern 7 is provided in a main area in the center part of the main surface of the insulating plate 3. The conductive pattern 7 has a T-letter shape on a plan view, and it is disposed with the T-letter shape being laid sideways as shown in FIG. 8. Specifically, the conductive pattern 7 is configured by interconnecting a long part 7a (first long part) extended in the top-and-bottom direction of FIG. 8 and a long part 7b (second long part) extended toward the left direction from substantially the center of the top-and-bottom direction of the long part 7a. The plurality of IGBT elements 11 and the plurality of free wheeling diodes 37 described above are disposed on the long part 7a. Further, on the long part 7b, the first terminal region 36 connected to the input terminal (P) on the high potential side of the power module is provided. Note that the first terminal region 36 may simply be referred to as the P-terminal.

The conductive pattern 31 (second conductive pattern) is formed to surround a part of the conductive pattern 7. The conductive pattern 31 has a U-letter shape on a plan view so as to surround the left end side of the conductive pattern 7, and its open end is facing toward the conductive pattern 7 side. Specifically, the conductive pattern 31 is configured with a pair of long parts 31a (third long parts) disposed to sandwich the long part 7b from the top and bottom and a long part 31b (fourth long part) interconnecting ends of the pair of long parts 31a on the left end side of the long part 7b.

The long part 31a is extended in the left-and-right direction, and the long part 31b is extended in the top-and-bottom direction. The width of the long part 31b in the left-and-right direction is set to be sufficiently smaller than the width of the long part 31a in the top-and-bottom direction. The long part 31b configures the third wiring member. While the third wiring member is formed with the conductive pattern in FIG. 8, the configuration is not limited thereto. The third wiring member may be formed with a conductor wire or a metal wiring board (lead frame). Further, it is also possible to change as appropriate the connection points of the third wiring member with the pair of long parts 31a. The third wiring member may be formed with a portal or arch-like metal wiring board or conductor wire placed to across the long part 7b, for example. The conductive pattern 33 is configured, in the right side of the long part 7a, with a long body extended in the top-and-bottom direction along the long part 7a. Further, the conductive pattern 31 configures the second conductive pattern that is connected to the intermediate potential.

On the main surface of the insulating plate 4 disposed neighboring to the lower side of the insulating plate 3, a plurality of conductive patterns (8, 31, 33) including the conductive pattern 8 (first conductive pattern) are provided in an island form (being electrically insulated from each other). The conductive pattern 8 is provided in a main area in the center part of the main surface of the insulating plate 4. The conductive pattern 8 has a T-letter shape on a plan view, and it is disposed with the T-letter shape being laid sideways as shown in FIG. 8. Specifically, the conductive pattern 8 is configured by interconnecting a long part 8a (first long part) extended in the top-and-bottom direction of FIG. 8 and a long part 8b (second long part) extended toward the left direction from substantially the center of the top-and-bottom direction of the long part 7a. The plurality of IGBT elements 13 and the plurality of free wheeling diodes 40 described above are disposed on the long part 8a. Further, on the long part 8b, the first terminal region 39 connected to the input terminal (P) on the high potential side of the power module is provided. Note that the first terminal region 39 may simply be referred to as the P-terminal.

The conductive pattern 31 (second conductive pattern) on the insulating plate 4 is formed to surround a part of the conductive pattern 8. The conductive pattern 31 has a U-letter shape on a plan view so as to surround the left end side of the conductive pattern 8, and its open end is facing toward the conductive pattern 8 side. Specifically, the conductive pattern 31 is configured with a pair of long parts 31a (third long parts) disposed to sandwich the long part 8b from the top and bottom and a long part 31b (fourth long part) interconnecting ends of the pair of long parts 31a on the left end side of the long part 8b. As described above, the long part 31b configures the third wiring member.

On the main surface of the insulating plate 5 disposed neighboring to the left side of the insulating plate 3, the plurality of conductive patterns (9, 71, 73) including the conductive pattern 9 (third conductive pattern) are provided in an island form (being electrically insulated from each other). The conductive pattern 9 is provided in a main area in the center part of the main surface of the insulating plate 5. The conductive pattern 9 has a U-letter shape on a plan view with the right end side being open. Specifically, the conductive pattern 9 is configured by interconnecting a main part 9a located in the center area of the insulating plate 5 and a pair of long parts 9b (fifth long parts) extended in the right direction from the end parts on top and bottom of the main part 9a toward the right end part of the insulating plate 5. In the center of the main part 9*a*, the plurality of IGBT elements 15 and the plurality of free wheeling diodes 76 described above are disposed. The IGBT elements 15 are disposed on the left side, and the free wheeling diodes 76 are disposed on the right side. The left side of the main part 9*a* is projected in a step-like form toward the left direction. On the top surface of the projected main part 9*a*, the second terminal region 61 that is connected to the output terminal (O) of the intermediate potential of the power module is provided. The second terminal region 61 is disposed in the left direction of the of the IGBT elements 15. Note that the second terminal region 61 may simply be referred to as the intermediate terminal (M-terminal) connected to the intermediate potential.

The conductive pattern 71 (fourth conductive pattern) is provided at an opposing position on the opposite side of the conductive pattern 7 with the long part 31*b* interposed therebetween. The conductive pattern 71 has a T-letter shape laid sideways on a plan view. The conductive pattern 71 is disposed in the right direction of the main part 9*a*, and sandwiched by the pair of long parts 9*b* from the top and bottom. On the conductive pattern 71, the third terminal region 81 that is connected to the input terminal (N) on the low potential side of the power module is provided. The third terminal region 81 is counter-disposed with respect to the first terminal region 36. Note that the third terminal region 81 may simply be referred to as the N-terminal. In the left direction of the main part 9*a*, the conductive pattern 73 extended in the top-and-bottom direction along the main part 9*a* is disposed.

On the main surface of the insulating plate 6 disposed neighboring to the lower side of the insulating plate 5 and neighboring to the left side of the insulating plate 4, the plurality of conductive patterns (10, 71, 73) including the conductive pattern 10 (third conductive pattern) are provided in an island form (being electrically insulated from each other). The conductive pattern 10 is provided in a main area in the center part of the main surface of the insulating plate 6. The conductive pattern 10 has a U-letter shape on a plan view with the right end side being open. Specifically, the conductive pattern 10 is configured by interconnecting a main part 10*a* located in the center area of the insulating plate 6 and a pair of long parts 10*b* (fifth long parts) extended in the right direction from the end parts on top and bottom of the main part 10*a* toward the right end part of the insulating plate 6. In the center of the main part 10*a*, the plurality of IGBT elements 17 and the plurality of free wheeling diodes 78 described above are disposed. The IGBT elements 17 are disposed on the left side, and the free wheeling diodes 78 are disposed on the right side. The left side of the main part 10*a* is projected in a step-like form toward the left direction. On the top surface of the projected main part 10*a*, the second terminal region 62 that is connected to the output terminal (O) of the intermediate potential of the power module is provided. The second terminal region 62 is disposed in the left direction of the of the IGBT elements 17. Note that the second terminal region 62 may simply be referred to as the intermediate terminal (M-terminal) connected to the intermediate potential.

The conductive pattern 71 (fourth conductive pattern) on the insulating plate 6 is provided at an opposing position on the opposite side of the conductive pattern 8 with the long part 31*b* of the insulating plate 4 interposed therebetween. The conductive pattern 71 has a T-letter shape being laid sideways on a plan view. The conductive pattern 71 is disposed in the right direction of the main part 10*a*, and sandwiched by the pair of long parts 10*b* from the top and bottom. On the conductive pattern 71, the third terminal region 82 that is connected to the input terminal (N) on the low potential side of the power module is provided. The third terminal region 82 is counter-disposed with respect to the first terminal region 39. Note that the third terminal region 82 may simply be referred to as the N-terminal. In the left direction of the main part 10*a*, the conductive pattern 73 extended in the top-and-bottom direction along the main part 10*a* is disposed.

In the upper arm, the IGBT elements 11 and the free wheeling diodes 37 disposed as pairs in the insulating plate 3 are electrically connected via the conductor wires W11 (first main current wiring member). Further, each of the free wheeling diodes 37 is electrically connected to the conductive pattern 31 via the conductor wires W12 (first main current wiring member). Specifically, each of the conductor wires W12 is connected to the right end part (other end part) of the long part 31*a*. Similarly, in the insulating plate 4, the IGBT elements 13 and the free wheeling diodes 39 disposed as pairs are electrically connected via the conductor wires W11. Further, each of the free wheeling diodes 39 is electrically connected to the conductive pattern 31 via the conductor wires W12. Specifically, each of the conductor wires W12 is connected to the right end part of the long part 31*a*.

In the lower arm, the IGBT elements 15 and the free wheeling diodes 76 disposed as pairs in the insulating plate 5 are electrically connected via the conductor wires W21 (first main current wiring member). Further, each of the free wheeling diodes 76 is electrically connected to the left end part of the conductive pattern 71 via the conductor wires W22 (first main current wiring member). Similarly, in the insulating plate 6, the IGBT elements 17 and the free wheeling diodes 78 disposed as pairs are electrically connected via the conductor wires W21. Further, each of the free wheeling diodes 78 is connected to the left end part of the conductive pattern 71 via the conductor wires W22.

Further, in the second embodiment, among the plurality of switching elements 11, 13 belonging to the upper arm, emitter electrodes of the IGBT elements 11, 13 disposed on the different conductive patterns 7, 8 are directly connected to each other via the conductor wire 19 (first wiring member) as the wiring member. Further, among the plurality of switching elements 15, 17 belonging to the lower arm, emitter electrodes of the IGBT elements 15, 17 disposed on the different conductive patterns 9, 10 are directly connected to each other via the conductor wire 20 (first wiring member) as the wiring member. Further, as described above, emitter electrodes of the IGBT elements (11), (13), (15), and (17) disposed on the same conductive patterns (7 to 10) are directly connected to each other via the conductor wires 21 to 24 (second wiring members) as the other wiring members, respectively. Note that, as described above, the conductor wires 19, 12 as the wiring members configure the first wiring members, and the conductor wires 21 to 24 as the other wiring members configure the second wiring members.

Furthermore, the conductive pattern 31 on the insulating plate 3 configuring the upper arm is connected to the conductive pattern 9 on the insulating plate 5 configuring the lower arm via the conductor wires W13 (second main current wiring member). Specifically, one end of the conductor wire W13 is connected to the base end part (connection part between the long part 31*a* and the long part 31*b*) of the long part 31*a*, and the other end is connected to the right end part of the long part 9*b*. Similarly, the conductive pattern 31 on the insulating plate 4 configuring the upper arm is connected to the conductive pattern 10 on the insulating plate 6 configuring the lower arm via the conductor wires W13. Specifically, one end of the conductor wire W13 is connected to the base end part (connection part between the long part 31a and the long part 31b) of the long part 31a, and the other end is connected to the right end part of the long part 10b.

A modification example shown in FIG. 9 is different from the configuration of FIG. 8 in respect that, instead of connecting the emitter electrodes of the switching elements via the wiring members, the second conductive patterns 31 disposed on the different substrates 3, 4 in the upper arm are connected to each other via the fourth wiring member (conductor wire 25). As described above, since the second conductive pattern is formed in a U-letter shape on a plan view, the second conductive patterns 31 disposed on the neighboring different substrates 3, 4 can be connected with the shortest distance. As for the configuration, the feature of FIG. 8 and the feature of FIG. 9 may be combined. That is, in FIG. 8, the second conductive patterns 31 disposed on the different substrates 3, 4 may be connected via the fourth wiring member (conductor wire 25).

As described, in the second embodiment, the emitter electrodes of the switching elements disposed on the different conductive patterns and connected in parallel among the plurality of switching elements are also connected via the wiring members (conductor wires 19, 20) and the emitter electrodes of the plurality of switching elements disposed on the same conductive pattern are also connected directly via other wiring members (conductor wires 21 to 24) to make it possible to decrease the inductance so as to suppress the oscillation phenomenon at the time of switching operations.

In the second embodiment, in the upper arm, the first conductive patterns (conductive patterns 7, 8) are formed in a T-letter shape on a plan view, and disposed such that a part of (long parts 7b, 8b) the first conductive patterns is sandwiched by the pair of long parts 31a. Furthermore, the pair of long parts 31a are connected by the long part 31b as the third wiring member. This makes it possible to increase the suppressing effect of the oscillation phenomenon still more. Further, by forming the second conductive pattern (conductive pattern 31) in a U-letter shape on a plan view to surround the root part of the T-letter shaped first conductive pattern so that the second conductive pattern surrounds the first conductive pattern, the switching elements on the first conductive pattern (the free wheeling diodes 37 on the long part 7a and the free wheeling diodes 40 on the long part 8a) and the second conductive pattern (long part 31a) can be connected with the shortest distance via the first main current wiring member (conductor wires W12). Thereby, the voltage drop in the conductor wires W12 can be made small, so that the on-resistance can be decreased.

Further, in the lower arm, the third conductive patterns (conductive patterns 9, 10) are formed in a U-letter shape on a plan view so as to surround the fourth conductive pattern (conductive pattern 71), so that a part of the third conductive patterns can be brought close to the upper arm side and the fourth conductive pattern can be disposed to be close to the upper arm side. Further, since the tips of the parts (long parts 9b, 10b) of the third conductive patterns are counter-disposed at the base ends of the second conductive pattern (long parts 31a), the long parts 9b, 10b and the long parts 31a can be connected with the shortest distance via the third wiring member (conductor wires W13). Further, since the long part 7b (8b) and the fourth conductive pattern are counter-disposed, the first terminal region 36 (39) and the third terminal region 81 (82) are counter-disposed. As a result, the P-terminal and the N-terminal can be disposed still closer, so that it is possible to further reduce the inductance so as to suppress generation of surge voltage and to increase the oscillation suppressing effect still more. As described above, according to the second embodiment, it is possible to achieve the power module corresponding to a high current of the upper and lower arms with low on-resistance and to suppress oscillation between the switching elements.

Hereinafter, the feature points of the above embodiments will be described.

The semiconductor device according to the embodiments includes: a substrate having a main surface; a plurality of conductive patterns provided on the main surface; a plurality of switching elements disposed on the plurality of conductive patterns such as to connect collector electrodes; and a single or a plurality of wiring members that directly connect emitter electrodes of the switching elements that are disposed on different conductive patterns and connected in parallel among the plurality of switching elements. With such configuration, the emitter electrodes of the switching elements disposed on the different conductive patterns and connected in parallel are directly connected to each other, so that it is possible to prevent the oscillation phenomenon of the potentials between the gates and emitters and the potential between the collectors and emitters of the IGBT elements connected in parallel.

In the semiconductor device, two switching elements whose emitter electrodes are directly connected via the wiring member are the two switching elements at the shortest distance between the plurality of switching elements disposed on one of the conductive pattern and the plurality of switching elements disposed on another one of the conductive patterns. With this configuration, the emitter electrodes of the two switching elements at the shortest distance are directly connected, so that it is possible to minimize the inductance component included in the wiring member and to improve the oscillation suppressing effect.

The semiconductor device includes another wiring member that directly connects the emitter electrodes of the plurality of switching elements disposed on a same conductive pattern. With such configuration, the emitter electrodes of the plurality of switching elements disposed on the same conductive patterns and the plurality of switching elements disposed on the different conductive patterns are connected via another wiring member, so that the oscillation suppressing effect can be improved further.

The semiconductor device includes: a first lead frame including a plurality of first leg parts connected to a plurality of first terminal regions provided to each of the conductive patterns where the plurality of switching elements are disposed such as to connect the collector electrodes, a first connection part connected to outside, and a first wiring part that connects between each of the first leg parts and the first connection part; a plurality of other conductive patterns provided on the main surface by corresponding to the plurality of conductive patterns, the plurality of other conductive patterns being connected to the emitter electrode of the switching elements disposed on each of the corresponding conductive patterns; and a second lead frame including a plurality of second leg parts connected to a plurality of second terminal regions provided to each of the other conductive patterns, a second connection part connected to outside, and a second wiring part that connects between each of the second leg parts and the second connection part.

In the semiconductor device, an array direction of the plurality of switching elements and an array direction of the plurality of second terminal regions are the same direction. In the semiconductor device, the array direction of the plurality of switching elements and the wiring direction of the wiring member are the same direction. Further, in the semiconductor device, the wiring direction of the wiring member and the wiring direction of the other wiring member are the same direction. Further, in the semiconductor device, the array direction of the plurality of switching elements, the wiring direction of the wiring members, the array direction of the first terminal regions, and the array direction of the second terminal regions may be the same direction. Further, in the semiconductor device, from the side closer to the array of the plurality of the switching elements, the wiring of the wiring members, the array of the first terminal regions, and the array of the second terminal regions may be disposed in this order.

In the semiconductor device, arms are configured with switching elements that simultaneously on-off operate among the plurality of switching elements, and emitter electrodes of the switching elements disposed on different conductive patterns on the same arm are connected to each other via the wiring member.

In the semiconductor device: the wiring member configures a first wiring member or a second wiring member; the upper arm and the lower arm are configured with the switching elements that simultaneously on-off operate among the plurality of switching elements; a plurality of the substrates are provided for each of the conductive patterns where the switching elements are disposed; the substrate belonging to the upper arm includes a first connective pattern where the switching element is disposed, the first conductive pattern being connected to an input terminal on a high potential side, and a second conductive pattern connected to an intermediate potential, the second conductive pattern being formed to surround the first conductive pattern; the first conductive pattern has a T-letter shape on a plan view, and includes a first long part extended in the arranged direction of the switching elements, and a second long part extended in a direction orthogonal to the arranged direction of the switching elements from an intermediate part in the extending direction of the first long part; the second conductive pattern includes a pair of third long parts extended along the second long part, the pair of third long parts being provided to sandwich the second long part; and the pair of third long parts are connected to each other via a third wiring member.

In the semiconductor device: the second conductive pattern further includes a fourth long part that interconnects end parts of the pair of third long parts, the second conductive pattern being formed in a U-letter shape on a plan view such as to surround the second long part with the third long parts and the fourth long part; and the fourth long part configures the third wiring member.

In the semiconductor device: the switching elements are disposed on the first long part; and the switching elements disposed on the first long part and the other end parts of the third long parts are connected via a first main current wiring member.

In the semiconductor device: the substrate belonging to the lower arm includes a third conductive pattern where the switching elements are disposed, the third conductive pattern being connected to an output terminal of an intermediate potential, and a fourth conductive pattern connected to an input terminal on a low potential side; the third conductive pattern has a U-letter shape on a plan view such as to surround the fourth conductive pattern, and includes a main part where the switching elements are disposed, and a pair of fifth long parts extended from the main part toward the upper arm side, the pair of fifth long part being provided such as to sandwich the fourth conductive pattern.

In the semiconductor device: tips of the fifth long parts are counter-disposed with base ends of the third long parts; and the tips of the fifth long parts and the base ends of the third long parts are connected via a second main current member.

In the semiconductor device: in the second long part, a first terminal region connected to the input terminal on the high potential side is provided; in the fourth conductive pattern, a third terminal region connected to the input terminal on the low potential side is provided; and the first terminal region and the third terminal region are counter-disposed.

In the semiconductor device, in the upper arm, the second conductive patterns disposed on the different substrates are connected to each other via a fourth wiring member.

Another semiconductor device described in the embodiment includes: a substrate having a main surface; a plurality of conductive patterns provided on the main surface; and a plurality of switching elements disposed on the plurality of conductive patterns such as to connect collector electrodes, wherein: an upper arm and a lower arm are configured with switching elements that simultaneously on-off operate among the plurality of switching elements; a plurality of the substrates are provided for each of the conductive patterns where the switching elements are disposed; the substrate belonging to the upper arm includes a first connective pattern where the switching elements are disposed, the first conductive pattern being connected to an input terminal on a high potential side, and a second conductive pattern connected to an intermediate potential, the second conductive pattern being formed to surround the first conductive pattern; the first conductive pattern has a T-letter shape on a plan view, and includes a first long part extended in an arranged direction of the switching elements, and a second long part extended in a direction orthogonal to the arranged direction of the switching elements from an intermediate part in the extending direction of the first long part; the second conductive pattern includes a pair of third long parts extended along the second long part, the pair of third long parts being provided to sandwich the second long part; the pair of third long parts are connected to each other via a third wiring member; and in the upper arm, the third long parts of the second conductive patterns disposed on the different substrates are connected to each other via a fourth wiring member.

In the semiconductor device: the second conductive pattern further includes a fourth long part that interconnects end parts of the pair of third long parts, the second conductive pattern being formed in a U-letter shape on a plan view such as to surround the second long part with the third long parts and the fourth long part; and the fourth long part configures the third wiring member.

INDUSTRIAL APPLICABILITY

The semiconductor device of the present invention is preferable for the power module in which a plurality of switching elements are connected in parallel.

This application is based upon Japanese patent Application No. 2018-172440, filed on Sep. 14, 2018, the entire contents of which are incorporated herein by reference.

What is claimed is:
1. A semiconductor device, comprising:
a substrate having a main surface;

a plurality of conductive patterns, including a plurality of primary conductive patterns and a plurality of secondary conductive patterns, provided on the main surface;

a plurality of switching elements, each having a first electrode and a second electrode, disposed on the plurality of primary conductive patterns, each primary conductive pattern having a plurality of the switching elements disposed thereon, each of which is connected to said each primary conductive pattern through the first or second electrode thereof; and a plurality of first wiring members that each directly connect the first electrodes of two switching elements that are respectively disposed on two different ones of the primary conductive patterns, and are electrically connected in parallel.

2. The semiconductor device according to claim 1, wherein:

said two different primary conductive patterns each have a plurality of switching elements thereon; and a distance between said two switching elements is shortest among all distances between any of the switching elements disposed on one of said two different primary conductive patterns and any of the switching elements disposed on the other of said two different primary conductive patterns.

3. The semiconductor device according to claim 1, further comprising a second wiring member that directly connects the first electrodes of the two switching elements disposed on a same one of the primary conductive patterns.

4. The semiconductor device according to claim 3, wherein a wiring direction of the first wiring member and a wiring direction of the second wiring member are parallel to each other.

5. The semiconductor device according to claim 3, wherein each of the plurality of conductive patterns includes a primary conductive pattern and an output pattern, the semiconductor device further comprises a first main current wiring member that electrically connects the first electrodes of switching elements disposed on one of the primary conductive patterns to a corresponding one of the output patterns, wherein the second wiring member is connected to the first electrodes at half sides of the two switching elements in width directions closer to the corresponding one of the output patterns than are the other half sides.

6. The semiconductor device according to claim 5, wherein:

said each primary conductive pattern includes a first terminal region or a second terminal region; and the second wiring member is connected to the first electrodes at half sides of the two switching elements in the width directions closer to the first or second terminal region than is the other half sides.

7. The semiconductor device according to claim 1, wherein:

said each primary conductive pattern, to which the second electrodes of the switching elements disposed thereon are connected;

the plurality primary conductive patterns include a plurality of first primary conductive patterns each including a first terminal region and a plurality of second primary conductive patterns each including a second terminal region; and the semiconductor device further comprises:

a first lead frame including a plurality of first leg parts each connected to one of the first terminal regions, a first connection part connected to a first external device, and a first wiring part that connects the plurality of first leg parts to the first connection part; and a second lead frame including a plurality of second leg parts each connected to one of the second terminal regions, a second connection part connected to a second external device, and a second wiring part that connects the plurality of second leg parts to the second connection part.

8. The semiconductor device according to claim 7, wherein an array direction of the plurality of switching elements, a wiring direction of the first wiring member, a wiring direction of the second wiring member, an array direction of the first terminal regions, and an array direction of the second terminal regions are parallel to one another.

9. The semiconductor device according to claim 1, wherein the switching elements disposed on said two different primary conductive patterns are aligned in a wiring direction in which the first wiring member connected to the two switching elements disposed on said two different primary conductive patterns extends.

10. The semiconductor device according to claim 1, wherein:

each of the plurality of conductive patterns includes a primary conductive pattern and an output pattern; and each primary conductive pattern includes a plurality of the switching elements disposed thereon, and is connected to the second electrodes of the switching elements disposed on said each primary conductive pattern, the semiconductor device further comprises a plurality of first main current wiring members each of which electrically connects the first electrodes of the switching elements disposed on one of the primary conductive patterns to a corresponding one of the output patterns, wherein said each first wiring member is connected to the first electrodes at half sides of the switching elements in width directions closer to the corresponding one of the output patterns than are the other half sides.

11. The semiconductor device according to claim 10, wherein said each primary conductive pattern includes a first terminal region or a second terminal region, the semiconductor device further comprises an input terminal disposed on the first terminal region or an output terminal disposed on the second terminal region, wherein said each first wiring member is connected to the first electrodes at half sides of the switching elements in the width direction closer to the first or second terminal region than are the other half sides.

12. The semiconductor device according to claim 1, wherein:

an upper arm and a lower arm each are respectively configured with a group of switching elements that are simultaneously turned on-off;

the upper arm includes a first conductive pattern and a second conductive pattern;

the first connective pattern where a plurality of the switching elements are disposed, is connected to an input terminal at a high potential side;

the second conductive pattern is connected to an intermediate potential, and is disposed to surround the first conductive pattern;

the first conductive pattern has a T shape in a plan view, and includes a first long part extending in a first direction in which the switching elements are aligned, and a second long part extending in a second direction orthogonal to the first direction from a center in the first direction of the first long part;

the second conductive pattern includes a pair of third long parts that extend in the second direction and sandwich the second long part therebetween; and the semiconductor device further comprising a third wiring member that connects the pair of third long parts to each other.

13. The semiconductor device according to claim 12, wherein:

the second conductive pattern further includes a fourth long part that connects one ends of the pair of third long parts to each other, the second conductive pattern having a U shape in the plan view to surround the second long part with the third long parts and the fourth long part; and the fourth long part configures the third wiring member.

14. The semiconductor device according to claim 13, further comprising a first main current wiring member that electrically connects the switching elements disposed on the first conductive pattern to the second conductive pattern, wherein:

the switching elements are disposed on the first long part; and the first main current wiring member connects the at switching elements to the other ends of the third long parts.

15. The semiconductor device according to claim 12, wherein:

the lower arm includes a third conductive pattern and a fourth conductive pattern;

the third conductive pattern, where a plurality of switching elements are disposed, is connected to an output terminal having the intermediate potential;

the fourth conductive pattern is connected to an input terminal at a low potential side; and the third conductive pattern has a U shape in the plan view to surround the fourth conductive pattern, and includes a main part where the switching elements are disposed, and a pair of fifth long parts extending from the main part toward an upper arm side, and sandwiching the fourth conductive pattern therebetween.

16. The semiconductor device according to claim 15, wherein:

tips of the fifth long parts face the third long parts in the first direction; and the semiconductor device further comprising a second main current member that connects the tips of the fifth long parts to the third long part.

17. The semiconductor device according to claim 15, wherein:

the second long part includes a first terminal region connected to the input terminal at the high potential side;

the fourth conductive pattern includes a third terminal region connected to the input terminal at the low potential side; and the first terminal region faces the third terminal region in the first direction.

18. The semiconductor device according to claim 12, wherein:

the upper arm further includes an other second conductive pattern; and the semiconductor device further comprising a fourth wiring member that connects the second conductive pattern to the other second conductive pattern.

19. A semiconductor device, comprising:

a plurality of substrates each having a main surface;

a plurality of conductive patterns provided on the main surface of one of the substrates;

a plurality of switching elements disposed on the plurality of conductive patterns, each switching element having a first electrode and a second electrode, and being connected to the one of the plurality of conductive patterns through its first or second electrode; and a plurality of third wiring members and a fourth wiring member, wherein:

an upper arm and a lower arm are respectively configured with a group of switching elements that are simultaneously turned on-off;

the upper arm includes a plurality of substrates, each substrate including a first conductive pattern and a second conductive pattern;

the first connective pattern where a plurality of switching elements are disposed is connected to an input terminal at a high potential side;

the second conductive pattern is connected to an intermediate potential and is disposed to surround the first conductive pattern;

the first conductive pattern has a T shape in a plan view, and includes a first long part extending in a first direction in which the switching elements are aligned, and a second long part extending in a second direction orthogonal to the first direction from a center in the first direction of the first long part;

the second conductive pattern includes a pair of third long parts extending in the second direction, and sandwiching the second long part therebetween;

the pair of third long parts are connected to each other via one of the third wiring members; and the third long parts of the second conductive patterns disposed on different substrates in the upper arm are connected to each other via the fourth wiring member.

20. The semiconductor device according to claim 19, wherein:

the second conductive pattern further includes a fourth long part that connects ends of the pair of third long parts to each other, the second conductive pattern having a U shape in the plan view to surround the second long part with the third long parts and the fourth long part; and the fourth long part is the one of the third wiring members.

* * * * *